(12) United States Patent
Tucholski

(10) Patent No.: US 7,173,554 B2
(45) Date of Patent: Feb. 6, 2007

(54) METHOD AND A DIGITAL-TO-ANALOG CONVERTER FOR CONVERTING A TIME VARYING DIGITAL INPUT SIGNAL

(75) Inventor: Hans Juergen Tucholski, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/280,905

(22) Filed: Nov. 16, 2005

(65) Prior Publication Data

US 2006/0145902 A1 Jul. 6, 2006

Related U.S. Application Data

(60) Provisional application No. 60/628,716, filed on Nov. 17, 2004.

(51) Int. Cl.
*H03M 1/66* (2006.01)

(52) U.S. Cl. ...................................... 341/150; 341/144

(58) Field of Classification Search ......... 341/144–172
See application file for complete search history.

(56) References Cited

U.S. PATENT DOCUMENTS

| 5,585,802 | A  | * | 12/1996 | Cabler et al. ................ 341/144 |
| 6,445,318 | B1 | * | 9/2002  | Ruha et al. .................. 341/131 |
| 6,590,516 | B2 | * | 7/2003  | Inagaki et al. ............... 341/144 |
| 6,753,706 | B2 | * | 6/2004  | Ho .............................. 341/144 |
| 6,809,673 | B2 | * | 10/2004 | Scanlan et al. .............. 341/144 |

FOREIGN PATENT DOCUMENTS

GB 2010032 6/1979

OTHER PUBLICATIONS

Wang, Hong-wei, et al, "High speed digital-to-analog converter with linear interpolator", IEEE Transactions on Consumer Electronics, vol. 46, No. 4, Nov. 2000, pp. 1137-1142.

* cited by examiner

*Primary Examiner*—Rexford Barnie
*Assistant Examiner*—Lam T. Mai
(74) *Attorney, Agent, or Firm*—Wolf, Greenfield & Sacks P.C.

(57) ABSTRACT

A digital-to-analogue converter (DAC) (1) comprises a digital processing circuit (2) having an input register (10) to which data samples of a digital input signal are written at a data sampling rate ($f_s$). A delay register (14) holds each data sample for one clock cycle of the data sampling rate ($f_s$), and a subtracting circuit (15) sequentially produces difference values between consecutive ones of the data samples by subtracting the data sample in the delay register (14) from the input register (12) on each clock cycle of the data sampling rate ($f_s$). The difference values are sequentially converted to proportional analogue current signals by a current steering DAC circuit (3) which sequentially steers the proportional current signals for the duration of the respective clock cycles of the data sampling rate ($f_s$) to a predominantly capacitive load impedance (4), which is coupled to ground 8 through a voltage reference source (5) and the voltage developed across the predominantly capacitive load impedance (4) with respect to ground (8) is a continuously linearly interpolated analogue voltage representative of the data sample of the digital input signal.

63 Claims, 10 Drawing Sheets

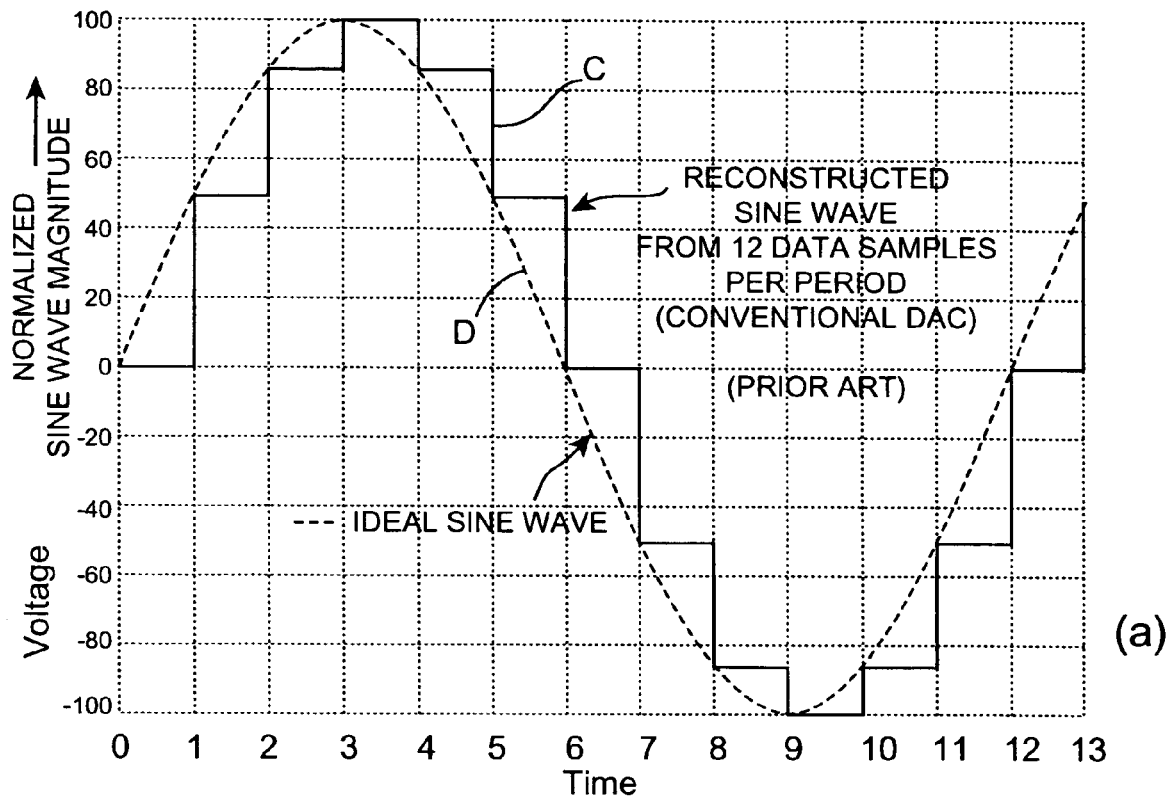
(a)
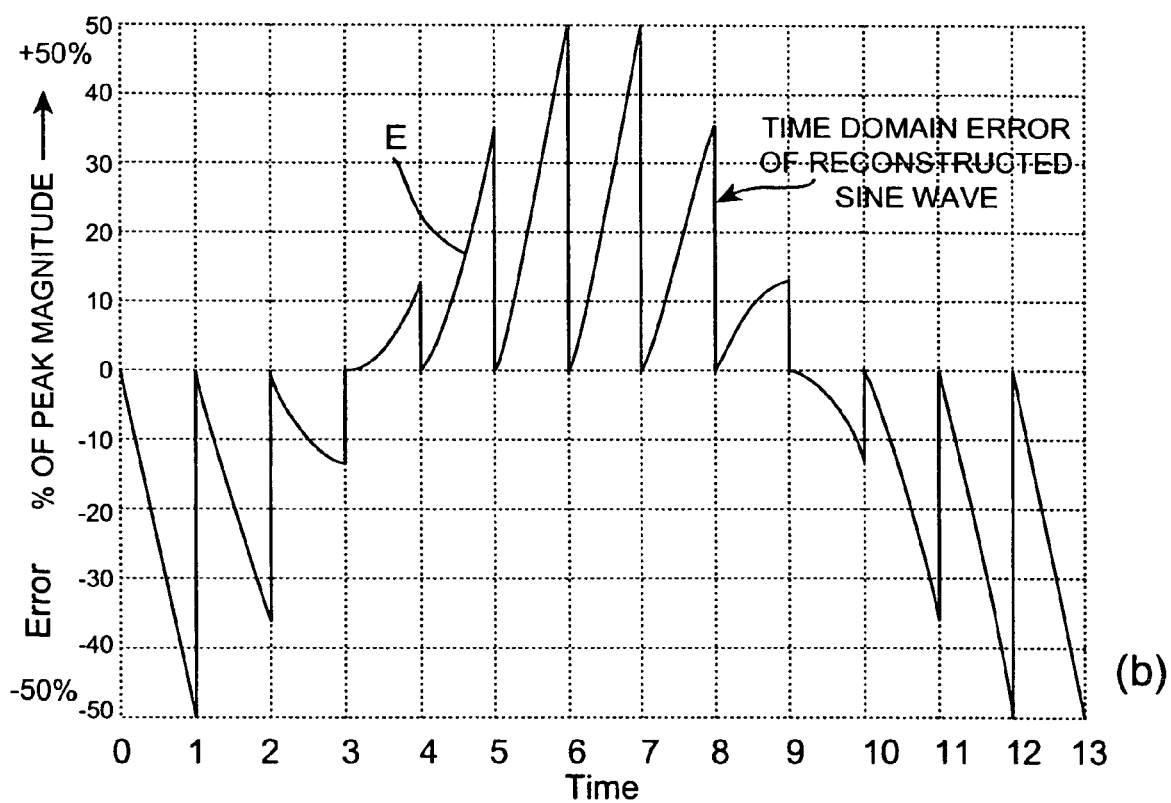
(b)
Fig. 4

METHOD AND A DIGITAL-TO-ANALOG CONVERTER FOR CONVERTING A TIME VARYING DIGITAL INPUT SIGNAL

Priority under 35 U.S.C., Section 119(e) is hereby claimed to U.S. Provisional Application Ser. No. 60/628,716, filed on Nov. 17, 2004 entitled "A METHOD AND A DIGITAL-TO-ANALOGUE CONVERTER FOR CONVERTING A TIME VARYING DIGITAL INPUT SIGNAL TO A CONTINUOUSLY LINEARLY INTERPOLATED ANALOGUE VOLTAGE OUTPUT SIGNAL AND A FREQUENCY SYNTHESISER FOR SYNTHESISING A SIGNAL WITH JITTER MINIMISED".

FIELD OF THE INVENTION

The present invention relates to a method for converting a time varying digital input signal comprising consecutive data samples at a data sampling rate to a continuously linearly interpolated analogue voltage output signal with substantially infinite resolution. The invention also relates to a digital-to-analogue converter (DAC) and a method for operating a current steering DAC for converting a time varying digital input signal comprising consecutive data samples at a data sampling rate to a continuously linearly interpolated analogue voltage output signal with substantially infinite resolution. The invention further relates to a method and to a frequency synthesiser for synthesising a frequency from a reference frequency with jitter minimised, and the invention also relates to a direct digital synthesiser.

BACKGROUND TO THE INVENTION

DACs, including current steering DACs, are used to convert time varying digital input signals to analogue output signals. The digital signals typically are provided from digital signal processing circuits, and the digital signal comprises a plurality of consecutive data samples provided to the DAC at a data rate, which is the rate or sampling frequency at which an analogue signal is sampled to produce the data samples of the digital signal. In current steering DACs, typically, the data samples are sequentially converted to respective current signals which are proportional to the values of the corresponding data samples. The current signals are sequentially steered by the DAC through a load resistor, across which an analogue voltage output proportional to the values of the data samples is developed. The current signals are steered through the load resistor for respective durations corresponding to the period of the sampling frequency.

Such current steering DACs are commonly used in conjunction with direct digital synthesisers, where a plurality of consecutive data samples representative of a sine waveform are generated. The data samples are converted by the current steering DAC into consecutive proportional currents, which are steered through the load resistor, across which a corresponding analogue voltage output is developed, which is representative of the sine waveform. The quality of the reconstructed analogue waveform depends fundamentally on the magnitude of the waveform errors contributed to by the resolution of the DAC. These errors can be reduced by increasing the data sampling rate at which the data samples are provided to the DAC, and also by increasing the resolution of the DAC. However, increasing the data sampling rate and the resolution of a DAC requires a corresponding increase in the word length and address range of, for example, a look-up table in the direct digital synthesiser. Accordingly, the selection of the data sampling rate and the resolution of a DAC, in general, is based on a compromise between high performance and technical and economical limitations.

A number of methods for increasing the performance of a DAC have been developed. One such method is commonly referred to as "sampled linear interpolation". One form of sampled linear interpolation requires determining the difference between consecutive data samples received by the DAC. This is achieved by subtracting the value of the immediately previous data sample received by the DAC from the current data sample received by the DAC. The difference between the data samples is divided by an oversampling factor N into N equal data values, which are sequentially and cumulatively added to the immediately previous data sample at an oversampling rate, which is the product of the data sampling rate by the oversampling factor N. The resulting oversampled digital data represents a waveform with sampled linear interpolation between the respective data samples received by the DAC. In this method the DAC is operated at the oversampling rate, and in order to avoid large non-linearity errors due to truncation of fractional parts of the interpolated data values, the resolution of the DAC must be increased. Such a sampled linear interpolation method is disclosed in a paper entitled "High speed CMOS digital-to-analog converter with linear interpolator" by Wang, Chan and Choy published in *IEEE Transactions on Consumer Electronics*, Volume 46, No. 4, November 2000.

While the method disclosed by Wang, et al avoids the requirement to increase the word length of a look-up table of, for example, a direct digital synthesiser, the method of Wang requires an increase in both the DAC data sampling rate and the resolution of the DAC. The degree to which the sampling rate and the resolution of a DAC can be increased is limited by various parameters, for example, technological limits, power requirement, silicon area and, in general, cost considerations.

A DAC which would operate on the principle of sampled linear interpolation is illustrated in FIG. 1, and is indicated generally by the reference numeral 100. The prior art DAC 100 comprises a digital signal processing circuit 101, and a current steering DAC circuit 102. The digital signal processing circuit 101 receives data samples of the digital input signal into an input register 103 at a data sampling rate $f_s$. The data samples are clocked from the input register 103 into a delay register 104 at the data sampling rate $f_s$, where they are stored for one clock cycle of the data sampling rate $f_s$. The data sampling rate $f_s$ is derived from a data sampling clock signal $f_s$ applied to the current steering DAC 100. A subtracting circuit 105 subtracts the value of the data sample in the delay register 104 from the value of the current data sample in the input register 103 to provide a difference value, which is the difference between the current data sample and the immediately previously received data sample. A divider circuit 106 divides the difference value by an oversampling factor N into N equal data values, one of which is applied to an interpolation data adder 107, and is cumulatively added on sequential clock cycles at an oversampling rate $f_{os}$. The oversampling rate is equal to the product of the data sampling rate $f_s$ by the oversampling factor N. A frequency multiplier 108 multiplies the data sampling clock signal $f_s$ by the oversampling factor N to produce an oversampling clock signal $f_{os}$.

A multiplier circuit 109 multiplies the immediately previous data sample in the delay register 104 by the oversampling factor N for providing the immediately previous data sample N times at the oversampling rate $f_{os}$ to an adder 110, where the current cumulative value of the data values from the interpolation data adder 107 is added to the immediately previously received data sample at the oversampling rate $f_{os}$. The data values from the adder 110 are thus representative of a waveform with sampled linear interpolation between the respective data samples.

The data samples from the adder 110 are written to a DAC register 111 of the current steering DAC circuit 102 at the oversampling rate $f_{os}$. A current steering DAC 112 in the current steering DAC circuit 102 sequentially converts the data samples written to the DAC register 111 into corresponding proportional current signals which are proportional to the values of the respective data samples. The proportional current signals are sequentially steered by the DAC 112 through a load resistor $R_{out}$ which is coupled between an output terminal 113 of the current steering DAC circuit 102 and ground 114. The voltage appearing across the load resistor $R_{out}$ on the output terminal 113 with respect to ground 114 is an analogue voltage which is representative of the digital input signal with linear interpolation between the data samples.

As discussed above, while the prior art DAC 100 of FIG. 1 avoids the requirement of having to increase the word length of the look-up table of, for example, a direct digital synthesiser, and to some extent reduces waveform errors in the reconstructed waveform, significant waveform errors are still present in the reconstructed waveform as will be discussed below with reference to FIGS. 5(a) and 5(b). Furthermore, the prior art DAC 100 of FIG. 1 requires an increase in both the DAC data sampling rate and the resolution of the DAC.

There is therefore a need for a DAC which addresses these problems of prior art DACs, and which provides a reconstructed analogue output waveform with continuous linear interpolation, and thus with substantially infinite resolution, without the need for oversampling and without having to increase the resolution of the DAC.

In frequency synthesisers the frequencies which can be synthesised without jitter from a reference frequency, where the reference frequency is being divided by a divisor, which may be an integer, a fraction or an integer and a fraction is limited. Unless the divisor divides into the frequency of the reference frequency without a remainder, the synthesised frequency will include jitter. This is undesirable, and there is therefore a need for a frequency synthesiser which addresses this problem.

The present invention is directed towards providing a method for converting a time varying digital input signal comprising consecutive data samples to an analogue voltage output signal with substantially infinite resolution. The invention is also directed towards providing a method for operating a current steering DAC for converting a time varying digital input signal comprising consecutive data samples to an analogue voltage output signal with substantially infinite resolution. The invention is also directed towards providing a DAC for converting a time varying digital input signal comprising consecutive data samples to an analogue voltage output signal of substantially infinite resolution. The invention is further directed towards providing a method and a frequency synthesiser for synthesising a frequency with jitter minimised from a reference frequency. The invention is also directed towards providing a direct digital synthesiser.

SUMMARY OF THE INVENTION

According to the invention there is provided a method for converting a time varying digital input signal comprising consecutive data samples to a continuously linearly interpolated analogue voltage output signal, the method comprising:

sequentially providing difference values between at least some of the data samples and respective prior data samples of the digital input signal, sequentially converting the difference values into respective corresponding analogue proportional current signals of current values proportional to the corresponding difference values, and sequentially steering the proportional current signals to a predominantly capacitive load impedance for respective time periods, the durations of which correspond to the time periods between the data samples, the corresponding difference values of which are provided, for integrating the proportional current signals to develop the continuously linearly interpolated analogue voltage output signal.

Preferably, the durations of the time periods between the data samples, the difference values of which are provided are similar.

Advantageously, the difference values provided are the difference values between each data sample and its immediately preceding data sample.

In one embodiment of the invention the difference values between the data samples and the respective prior data samples are computed.

Ideally, each difference value is computed by subtracting the prior data sample of the digital input signal from the current data sample.

Preferably, each proportional current signal is indicative of the sign of the corresponding difference value.

In one embodiment of the invention the proportional current signal steered to the predominantly capacitive load impedance in response to a difference value of zero is a zero current signal.

In another embodiment of the invention each proportional current signal steered to the predominantly capacitive load impedance in response to the difference values being positive values is one of a positive flowing proportional current signal and a negative flowing proportional current signal, and each proportional current signal steered to the predominantly capacitive load impedance in response to the difference values being negative values is the other one of a positive flowing proportional current signal and a negative flowing proportional current signal. Preferably, the proportional current signals steered to the predominantly capacitive load impedance in response to the difference values being positive values are positive flowing proportional current signals, and the proportional current signals steered to the predominantly capacitive load impedance in response to the difference values being negative values are negative flowing proportional current signals.

In one embodiment of the invention the difference values are converted to the proportional current signals in a current steering digital-to-analogue converter (DAC).

Preferably, the predominantly capacitive load impedance comprises a capacitive element.

Advantageously, the predominantly capacitive load impedance comprises a resistive element coupled in parallel with the capacitive element for minimising voltage drift of a time average voltage of the analogue voltage output signal resulting from a time average current of the proportional current signals steered to the predominantly capacitive load impedance. Ideally, the resistive element of the predominantly capacitive load impedance is selected to be of resistance value equal to the quotient of a predetermined acceptable voltage offset from a time average voltage of an ideal analogue voltage signal representative of the consecutive data samples divided by the time average current of the proportional current signals steered to the predominantly capacitive load impedance.

Ideally, the capacitive element of the predominantly capacitive load impedance is selected to be of capacitance value so that during each time period between the data samples, the difference value of which is provided, the relationship between time and the voltage developed across the predominantly capacitive load impedance resulting from the proportional current signal steered thereto is substantially linear. Ideally, the time constant of the predominantly capacitive load impedance is selected to be of value significantly greater than the time period between the data samples, the difference value of which is provided.

The predominantly capacitive load impedance is coupled between a first node and a second node, the first node being adapted for receiving a voltage reference, the proportional current signals being steered through the second node, and the analogue voltage output signal being developed on the second node.

In another embodiment of the invention the digital input signal is representative of an arbitrary analogue signal.

In a further embodiment of the invention the digital input signal is representative of an oscillating analogue signal oscillating about an average value.

The invention also provides a method for operating a current steering DAC for converting a time varying digital input signal comprising consecutive data samples to a continuously linearly interpolated analogue voltage output signal, the method comprising:

sequentially providing difference values between at least some of the data samples and respective prior data samples of the digital input signal to the current steering DAC, sequentially converting the difference values into respective corresponding analogue proportional current signals in the current steering DAC, the proportional current signals being of current values proportional to the corresponding difference values, and sequentially steering the proportional current signals to a predominantly capacitive load impedance for respective time periods, the durations of which correspond to the time periods between the data samples, the corresponding difference values of which are provided, for integrating the proportional current signals to develop the continuously linearly interpolated analogue voltage output signal.

Additionally the invention provides a method for synthesising a frequency from a reference frequency, the method comprising:

sequentially accumulating a first digital word in a modulo-M accumulator on respective clock cycles of the reference frequency, the first digital word being representative of the value of a numerator of a fractional factor by which the reference frequency is to be multiplied to produce the synthesised frequency, and the modulus M of the accumulator being representative of the value of a denominator of the fractional factor, sequentially providing difference values between consecutive accumulated values of the first digital word produced by the accumulator on the respective clock cycles of the reference frequency, sequentially converting the difference values into respective corresponding analogue proportional current signals of current values proportional to the corresponding difference values, sequentially steering the proportional current signals to a predominantly capacitive load impedance for respective time periods each of duration corresponding to the period of one clock cycle of the reference frequency for integrating the proportional current signals to develop a continuously linearly interpolated analogue voltage signal representative of the accumulated values of the first digital word produced by the accumulator, and comparing the continuously linearly interpolated analogue voltage signal with a reference voltage level signal for producing the synthesised frequency.

In one embodiment of the invention the difference values between the consecutive accumulated values of the first digital word produced by the accumulator are sequentially computed. Preferably, the difference values between the consecutive accumulated values of the first digital word produced by the accumulator are computed by subtracting the immediately previously accumulated value of the first digital word produced by the accumulator from the current accumulated value.

In an alternative embodiment of the invention digital words corresponding to the difference values between the consecutive accumulated values of the first digital word produced by the accumulator are stored, and are sequentially selected in response to the state of the accumulator for conversion into the respective proportional current signals. Preferably, the first digital word is stored to provide one of the difference values, and a second digital word is stored to provide the other one of the difference values, the second digital word being representative of the negative value of the difference of the modulus M of the accumulator less the first digital word, the first digital word being selected for conversion to one of the proportional current signals on each clock cycle of the reference frequency when the accumulator is in a non-overflow state, and the second digital word being selected for conversion to another one of the proportional current signals on each clock cycle of the reference frequency when the accumulator is in an overflow state.

In one embodiment of the invention each positive difference value is converted to one of a positive flowing corresponding proportional current signal and a negative flowing corresponding proportional current signal, and each negative difference value is converted to the other of a positive flowing corresponding proportional current signal and a negative flowing corresponding proportional current signal. Preferably, each positive difference value is converted to a positive flowing proportional current signal, and each negative difference value is converted to a negative flowing proportional current signal.

Advantageously, the synthesised frequency is derived from each transition of the continuously linearly interpolated analogue voltage signal across the reference voltage level signal when the accumulator is in the non-overflow state.

Preferably, the value of the reference voltage level signal is selected to be of value within the value of the minimum positive peak value of the continuously linearly interpolated analogue voltage signal relative to a time average value thereof, and the value of the minimum negative peak value of the continuously linearly interpolated analogue voltage signal relative to the time average value thereof.

In one embodiment of the invention the first digital word is selectable.

In another embodiment of the invention the modulus M of the accumulator is selectable.

Further the invention provides a digital-to-analogue converter (DAC) for converting a time varying digital input signal comprising consecutive data samples to a continuously linearly interpolated analogue voltage output signal, the DAC comprising:

a digital signal processing circuit for sequentially providing difference values between at least some of the data samples and respective prior data samples of the digital input signal, a current steering DAC circuit for sequentially converting the difference values into respective corresponding analogue proportional current signals of current values proportional to the corresponding difference values, and a predominantly capacitive load impedance to which the proportional current signals are sequentially steered for respective time periods, the durations of which correspond to the time periods between the data samples, the corresponding difference values of which are provided, for integrating the proportional current signals to develop the continuously linearly interpolated analogue voltage output signal.

Preferably, the durations of the time periods between the data samples, the difference values of which are provided by the digital signal processing circuit are similar. Advantageously, the difference values provided by the digital signal processing circuit are the difference values between each data sample and its immediately preceding data sample.

In one embodiment of the invention the digital signal processing circuit computes the difference values between the data samples and the respective prior data samples.

Preferably, the digital signal processing circuit determines each difference value by subtracting the prior data sample of the digital input signal from the current data sample.

In one embodiment of the invention the digital signal processing circuit comprises a delay register for storing each data sample, which is to be subtracted from a subsequent one of the data samples, for a duration corresponding to the time period between the respective data samples, the difference value of which is to be computed. Preferably, the digital signal processing circuit comprises a subtracting circuit for subtracting the data sample currently stored in the delay register from the current data sample for providing each difference value. Advantageously, the delay register stores each data sample for one clock cycle of a data sampling rate at which the data samples of the digital input signal are provided to the digital signal processing circuit.

In one embodiment of the invention the current steering DAC circuit is configured to produce the proportional current signals to be indicative of the sign of the respective corresponding difference values.

In another embodiment of the invention the current steering DAC circuit is configured to have a transfer function so that a proportional current signal of current of zero value is produced in response to a difference value of zero.

In a further embodiment of the invention the current steering DAC circuit is configured to have a transfer function so that ones of positive flowing proportional current signals and negative flowing proportional current signals are produced in response to respective positive difference values, and the others of positive flowing proportional current signals and negative flowing proportional current signals are produced in response to respective negative difference values. Preferably, the current steering DAC circuit is configured to have a transfer function so that positive flowing proportional current signals are produced in response to respective positive difference values, and negative flowing proportional current signals are produced in response to negative difference values.

In one embodiment of the invention the predominantly capacitive load impedance comprises a capacitive element.

In another embodiment of the invention the predominantly capacitive load impedance comprises a resistive element coupled in parallel with the capacitive element for minimising voltage drift of a time average voltage of the analogue voltage output signal resulting from a time average current of the proportional current signals steered to the predominantly capacitive load impedance. Preferably, the resistive element of the predominantly capacitive load impedance is selected to be of resistance voltage equal to the quotient of a predetermined acceptable voltage offset from a time average voltage of an ideal analogue voltage signal representative of the consecutive data samples divided by the time average current of the proportional current signals steered to the predominantly capacitive load impedance.

In one embodiment of the invention the capacitive element of the predominantly capacitive load impedance is selected to be of capacitance value so that during each time period between the data samples, the difference value of which is provided, the relationship between time and the voltage developed across the predominantly capacitive load impedance resulting from the proportional current signal steered thereto is substantially linear.

Preferably, the time constant of the predominantly capacitive load impedance is significantly greater than the time period between data samples, the difference value of which is provided.

Advantageously, the predominantly capacitive load impedance is coupled between a first node and a second node, the first node being adapted for receiving a voltage reference, and the second node being coupled to the current steering DAC circuit, the proportional current signals being steered to the predominantly capacitive load impedance through the second node, and the continuously linearly interpolated analogue voltage output signal being developed on the second node.

In one embodiment of the invention the current steering DAC circuit comprises a current steering DAC.

In another embodiment of the invention the DAC is adapted for converting a digital input signal sampled from an arbitrary analogue signal.

In a further embodiment of the invention the DAC is adapted for converting a digital input signal sampled from an oscillating analogue signal which oscillates about an average value.

The invention also provides a frequency synthesiser for synthesising a frequency from a reference frequency, the frequency synthesiser comprising:

a digital signal processing circuit having a modulo-M accumulator for sequentially producing accumulated values of a first digital word on respective clock cycles of the reference frequency, the first digital word being representative of the value of a numerator of a fractional factor by which the reference frequency is to be multiplied to produce the synthesised frequency, and the modulus M of the accumulator being representative of the value of a denominator of the fractional factor, the digital signal processing circuit sequentially providing difference values between consecutive accumulated values of the first digital word produced by the accumulator on the respective clock cycles of the reference frequency, a current steering DAC circuit for sequentially converting the difference values provided by the digital signal processing circuit to respective analogue proportional current signals of current values proportional to the corresponding difference values, a predominantly capacitive load impedance to which the proportional current signals are sequentially steered by the current steering DAC circuit for respective time periods each of duration corresponding to the period of one clock cycle of the reference frequency for integrating the proportional current signals to develop a continuously linearly interpolated analogue voltage signal representative of the accumulated values of the first digital word produced by the accumulator, and a comparator for comparing the continuously linearly interpolated analogue voltage signal with a reference voltage level signal for producing the synthesised frequency.

In one embodiment of the invention the digital signal processing circuit comprises a subtracting circuit for subtracting the previous accumulated value of the first digital word produced by the accumulator from the current accumulated value for producing each difference value.

In an alternative embodiment of the invention the digital signal processing circuit comprises a first digital word storing register for storing the first digital word, and a second digital word storing register for storing a second digital word, the second digital word being representative of the negative value of the difference of the modulus M of the accumulator less the first digital word, the first digital word being applied to the current steering DAC circuit on each clock cycle of the reference frequency when the accumulator is in a non-overflow state, and the second digital word being applied to the current steering DAC circuit on each clock cycle of the reference frequency when the accumulator is in an overflow state.

Preferably, the digital signal processing circuit comprises a multiplexer for selectively and alternately coupling the first and second digital word storing registers to the current steering DAC circuit in response to the state of the accumulator.

In one embodiment of the invention the predominantly capacitive load impedance comprises a capacitive element.

In another embodiment of the invention the predominantly capacitive load impedance comprises a resistive element coupled in parallel with the capacitive element for minimising voltage drift of a time average voltage of the continuously linearly interpolated analogue voltage signal resulting from a time average current of the proportional current signals steered to the predominantly capacitive load impedance.

Preferably, the time constant of the predominantly capacitive load impedance is significantly greater than the time period of one clock cycle of the reference frequency.

In one embodiment of the invention the value of the reference voltage level signal is selected to be of value within the value of the minimum positive peak value of the continuously linearly interpolated analogue voltage signal relative to a time average value thereof, and the value of the minimum negative peak value of the continuously linearly interpolated analogue voltage signal relative to the time average value thereof.

Preferably, the comparator is configured to derive the synthesised frequency in response to the continuously linearly interpolated analogue voltage signal transitioning across the reference voltage level signal when the accumulator is in the non-overflow state.

In one embodiment of the invention the first digital word is selectable.

In another embodiment of the invention the modulus M of the accumulator is selectable.

The invention also provides a direct digital frequency synthesiser for synthesising an output signal of a selectable frequency from a reference frequency, the direct digital frequency synthesiser comprising:

a numerical controlled oscillator for sequentially producing phase determining digital words on respective clock cycles of the reference frequency indicative of the phase of the synthesised output signal in response to a frequency control digital word, a digital signal processing circuit for sequentially converting the phase determining digital words produced by the numerical controlled oscillator into digital words representative of the phase dependent magnitude of the synthesised output signal on respective clock cycles of the reference frequency, a subtracting circuit for sequentially computing difference values between digital words produced by the digital signal processing circuit on respective clock cycles of the reference frequency and the immediately produced digital word, a current steering DAC circuit for sequentially converting the difference values produced by the subtracting circuit to respective analogue proportional current signals of current values proportional to the corresponding difference values, and a predominantly capacitive impedance load to which the proportional current signals are sequentially steered by the current steering DAC circuit for respective time periods each of duration corresponding to the period of one clock cycle of the reference frequency for integrating the proportional current signals to develop the synthesised output signal of the selected frequency with continuous linear interpolation.

ADVANTAGES OF THE INVENTION

The advantages of the DAC according to the invention are many. The current steering DAC according to the invention provides a reconstructed analogue voltage output signal which is reconstructed from the data samples with substantially infinite resolution, and without oversampling and with no increase in the resolution of the current steering DAC being required. This is achieved by virtue of the fact that the reconstructed analogue voltage output signal is reconstructed with continuous linear interpolation. By sequentially determining difference values between the data samples, and sequentially converting the difference values to corresponding proportional current signals, which are proportional to the difference values, and by sequentially steering the proportional current signals to the predominantly capacitive load impedance for the duration of the time period between the data samples, the difference value of which is determined, the proportional current signals are integrated with respect to time during each time period, thereby producing a continuously linearly interpolated reconstructed analogue voltage output signal.

Accordingly, by appropriately configuring the transfer function of the DAC, to provide positive flowing proportional current signals corresponding to positive difference values, and negative flowing proportional current signals corresponding to negative difference values, each positive difference value results in a linear increase, with respect to time, in the voltage developed across the predominantly capacitive load impedance during the time period, during which the proportional current is steered to the predominantly capacitive load impedance, and vice versa in the case of a negative flowing proportional current signal, which results in a linear decrease, with respect to time in the voltage developed across the predominantly capacitive load impedance. Thus, the analogue voltage output signal is reconstructed with continuous linear interpolation, and thus is provided with substantially infinite resolution.

In cases where the DAC is configured with a transfer function which provides negative flowing proportional current signals in response to positive difference values, and vice versa in respect of negative difference values, the reconstructed analogue voltage output signal is an inversion of the original signal from which the data samples had been derived. However, in such cases the analogue voltage output signal is still constructed with continuous linear interpolation, and thus, is provided with substantially infinite resolution.

Each difference value may be determined between the current data sample and any prior data sample. For example, the difference values may be determined between every second data sample or every third data sample, or indeed, between every fourth or more data samples. However, the closer the data samples, between which the difference values are determined, are to each other, the more accurate will be the reconstructed analogue voltage output signal. The most accurate analogue voltage output signal is reconstructed when difference values are determined between consecutive ones of the data samples, and these difference values are converted into proportional current signals, which are sequentially steered to the predominantly capacitive load impedance.

By virtue of the fact that the reconstructed analogue voltage output signal is provided with continuous linear interpolation, and thus is provided with substantially infinite resolution, waveform errors in the analogue voltage output signal are minimised.

Similar advantages are provided by the method according to the invention for converting the time varying digital input signal to the analogue voltage output signal, and similar advantages are also achieved by the method according to the invention for operating a current steering DAC for converting a time varying digital input signal to an analogue voltage output signal.

The advantages of the frequency synthesiser according to the invention are many. The synthesised frequencies, which are synthesised by the frequency synthesiser from the reference frequency are synthesised without jitter, and furthermore, are synthesised without the need to construct a sine wave. By virtue of the fact that the analogue voltage signal developed across the predominantly capacitive load impedance is a reconstruction of the accumulated values of the first digital word produced by the accumulator, and is reconstructed with continuous linear interpolation, the period of the reconstructed analogue voltage signal from any point on the waveform of the reconstructed signal while the accumulator is in the non-overflow state, to the corresponding point on the waveform during the next cycle of the accumulator is constant. Thus, the synthesised frequency derived from the reconstructed analogue voltage signal is of constant period, and thus the synthesised frequency is synthesised without jitter.

A particular advantageous form of the frequency synthesiser according to the invention can be implemented by the realisation of the fact that the computation of the difference values between the consecutive accumulated values of the first digital word produced by the accumulator results in difference values of only two values being computed, namely, the difference value, which corresponds to the first digital word, which is the difference value determined on each clock cycle of the reference frequency while the accumulator is in a non-overflow state, and the difference value corresponding to the second digital word, which is the difference value determined on each clock cycle of the reference frequency when the accumulator is in an overflow state. The realisation of this fact leads to a simplification of the digital signal processing circuit of the frequency synthesiser, whereby instead of determining the difference values between the consecutive accumulated values of the first digital word produced by the accumulator on each clock cycle of the reference frequency, the first and second digital words can be stored, and appropriately written to the current steering DAC circuit on the appropriate ones of the respective clock cycles of the reference frequency in response to the overflow/non-overflow state of the accumulator. Thus, the need to compute the difference values between the consecutive accumulated values of the first digital word produced by the accumulator on each clock cycle of the reference frequency is avoided. The second digital word need only be computed once when a new first digital word representative of the numerator of a new fractional factor is written to the input register of the digital signal processing circuit.

The advantage of the direct digital frequency synthesiser according to the invention is that it produces a synthesised output signal of a selectable period, which as a result of continuous linear interpolation is substantially free of time jitter.

The invention and its many advantages will be readily apparent to those skilled in the art from the following description of some preferred embodiments thereof, which are given by way of example only, with reference to the accompanying drawings.

BRIEF DESCRIPTION OF THE DRAWINGS

FIG. 9 is a block representation of a frequency synthesiser according to the invention, FIG. 10 are graphical representations of waveforms of signals produced by the digital synthesiser of FIG. 9.

DETAILED DESCRIPTION OF PREFERRED EMBODIMENTS OF THE INVENTION

Figure 2:
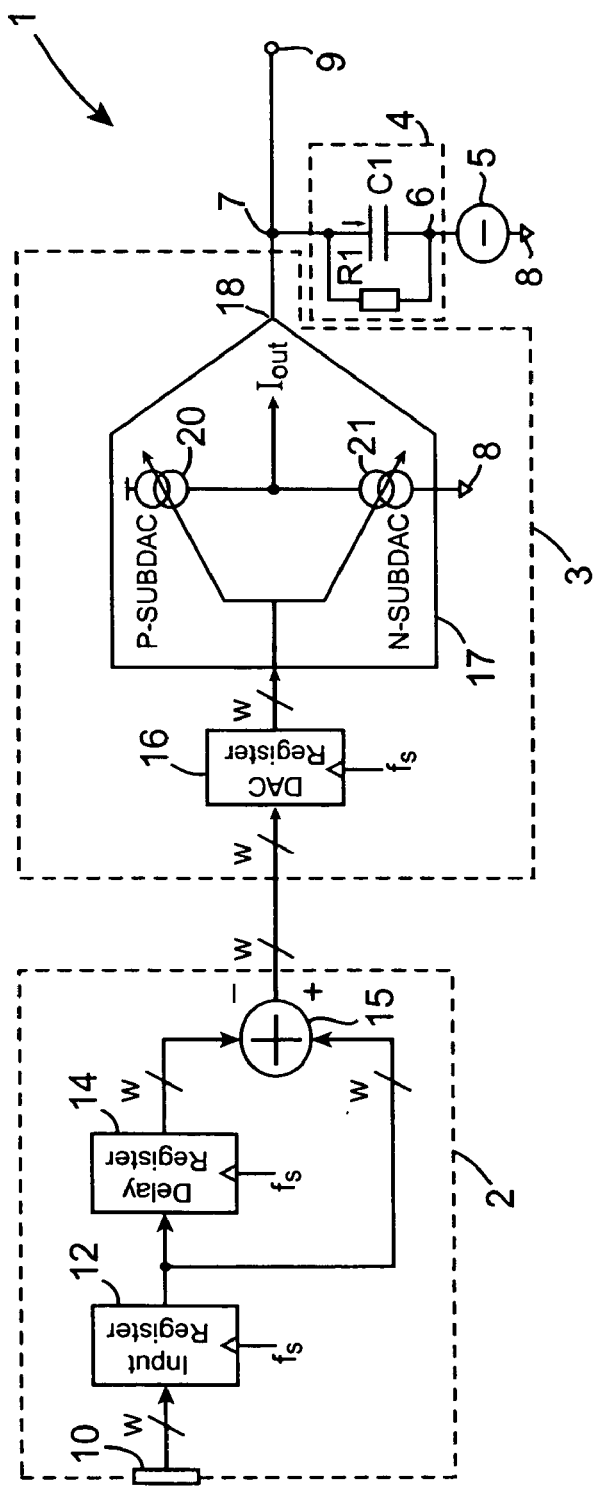
FIG. 2 is a block representation of a DAC according to the invention for converting a time varying digital input signal comprising consecutive data samples to an analogue voltage output signal with substantially infinite resolution and with waveform errors minimised, FIGS. 3($a$) and ($b$) are graphical representations of waveforms of signals generated by the DAC of FIG. 2, FIG. 4($a$) is a graphical representation of a reconstructed analogue voltage sine waveform produced by the prior art DAC of FIG. 1 without oversampling, FIG. 4($b$) is a graphical representation of waveform errors in the reconstructed waveform of FIG. 4($a$), FIG. 5($a$) is a graphical representation of a reconstructed analogue voltage sine waveform produced by the prior art DAC of FIG. 1 with oversampling, FIG. 5($b$) is a graphical representation of waveform errors in the reconstructed waveform of FIG. 5($a$)

Referring to the drawings and initially to FIG. 2, there is illustrated a digital-to-analogue converter (DAC) according to the invention, indicated generally by the reference numeral 1, for converting a time varying digital input signal comprising consecutive data samples provided to the DAC 1 at a data sampling rate $f_s$ into a reconstructed continuously linearly interpolated analogue voltage output signal of substantially infinite resolution. The DAC 1 comprises a digital signal processing circuit 2 for receiving the data samples at the data sampling rate $f_s$, and for sequentially determining difference values between consecutive data samples of the digital input signal on respective clock cycles of the data sampling rate $f_s$. A current steering DAC circuit 3 sequentially converts the difference values determined by the digital signal processing circuit 2 into corresponding proportional analogue current signals, the values of which are proportional to the respective corresponding difference values.

The proportional current signals are sequentially steered to a predominantly capacitive load impedance 4, each for the duration of one clock cycle of the data sampling rate $f_s$ for integrating the proportional current signals, for in turn developing the reconstructed continuously linearly interpolated analogue voltage output signal across the predominantly capacitive load impedance 4. The predominantly capacitive load impedance 4 is coupled to a voltage reference source 5 through a first node 6 and is coupled to the current steering DAC circuit 3 through a second node 7. The voltage reference source 5 is coupled to ground 8, and the continuously linearly interpolated analogue voltage output signal is developed on a main analogue output terminal 9 from the second node 7 with respect to ground 8.

The digital signal processing circuit 2 comprises a digital input port 10, which may be a serial or parallel port for receiving the data samples of the digital input signal at the data sampling rate $f_s$. The data samples are sequentially clocked into an input register 12 from the digital input port 10 at the data sampling rate $f_s$, and in turn to a delay register 14 at the data sampling rate $f_s$, where each data sample is stored for one clock cycle of the data sampling rate $f_s$.

A subtracting circuit 15 subtracts each data sample stored in the delay register 14 from the current data sample in the input register 12, and the difference values are sequentially applied to a DAC register 16 of the current steering DAC circuit 3 on respective clock cycles at the data sampling rate $f_s$. The difference values are applied to the DAC register 16 from the subtracting circuit 15 with the appropriate sign so that each difference value resulting from an increase in the digital input signal between consecutive data samples is represented as a positive difference value, and each difference value resulting from a decrease in the digital input signal between consecutive data samples is represented as a negative difference value. Any suitable method for indicating the sign of the difference values, which will be well known to those skilled in the art, may be used.

A current steering DAC 17 in the current steering DAC circuit 3 sequentially converts the difference values applied to the DAC register 16 on successive clock cycles at the data sampling rate $f_s$ to the proportional current signals, which are steered through an analogue output 18 of the current steering DAC 17 to the predominantly capacitive load impedance 4 through the second node 7. Each proportional current signal is steered by the current steering DAC 17 to the predominantly capacitive load impedance 4 for a time period of duration corresponding to the time period of the data sampling rate $f_s$, in other words, for a time period corresponding to one clock cycle of the data sampling rate $f_s$, thereby providing the analogue voltage output signal on the main output terminal 9 with continuous linear interpolation.

The current steering DAC 14 comprises a P-SUBDAC 20 and an N-SUBDAC 21, and is configured with a transfer function so that the proportional current signal steered through the analogue output 18 in response to a difference value of zero applied to the DAC register 16 is zero amps, the proportional current signals steered through the analogue output 18 in response to positive difference values applied to the DAC register 16 are positive flowing proportional current signals, and the proportional current signals steered through the analogue output 18 in response to negative difference values being applied to the DAC register 16 are negative flowing proportional current signals. Each positive flowing proportional current signal is proportional to the corresponding positive difference value applied to the DAC register 16, and each negative flowing proportional current signal is proportional to the corresponding negative difference value applied to the DAC register 16.

In this embodiment of the invention the P-SUBDAC 20 comprises a selectively variable current source, which is responsive to the positive difference values applied to the DAC register 16 for producing the positive flowing proportional current signals through the analogue output 18, in other words, the proportional current signals flowing outwardly through the analogue output 18 from the current steering DAC 17 to the predominantly capacitive load impedance 4. The N-SUBDAC 21 comprises a selectively variable current source, which is responsive to negative difference values applied to the DAC register 16 for producing the negative flowing proportional current signals through the analogue output 18, in other words, the proportional current signals flowing from the predominantly capacitive load impedance 4 into the current steering DAC 17 through the analogue output 18.

The predominantly capacitive load impedance 4 comprises a capacitive element, namely, a load capacitor C1 for integrating the proportional current signals steered by the current steering DAC circuit 3, and a resistive element, namely, a resistor R1 coupled in parallel with the load capacitor C1 for limiting voltage drift of the analogue voltage output signal on the main output terminal 9, which would result from mismatch of the current sources of the P-SUBDAC 20 and the N-SUBDAC 21. Ideally, the absolute values of the proportional current signals produced by the variable current sources of the P and N SUBDACs 20 and 21 of the current steering DAC 17 for given similar absolute difference values produced by the digital processing circuit 2 should be identical. However, due to mismatching of components in the variable current sources of the P and N SUBDACs 20 and 21 resulting from process variations, the absolute values of the proportional current signals produced by the respective current sources of the P and N SUBDACs 20 and 21 corresponding to similar absolute difference values may not be identical. This lack of matching of the current sources of the P and N SUBDACs 20 and 21 results in a time average current of the proportional current signals steered through the analogue output 18 of the current steering DAC 17 not being zero. The time average current of the proportional current signals steered by the current steering DAC 17 not being zero, results in a voltage drift in a time average voltage of the analogue voltage output signal from a time average voltage of an ideal analogue voltage signal representative of the data samples of the digital input signal.

The resistance value of the resistor R1 is selected to maintain the voltage offset of the actual time average voltage of the analogue voltage output signal on the main output terminal 9 relative to a time average voltage of an ideal analogue voltage signal representative of the digital input signal at a predetermined acceptable voltage offset. Accordingly, where $V_{os}$ represents the predetermined acceptable voltage offset, and $I_{drift}$ represents the time average current of the proportional current signals steered through the analogue output 18 of the current steering DAC 17, the resistance R of the resistor R1 is selected by the following equation:

$$R = \frac{V_{os}}{I_{drift}}$$

The capacitance of the capacitor C1 is selected so that the R-C time constant of the predominantly capacitive load impedance 4 is significantly greater than the time period of one clock cycle of the data sampling rate $f_s$ in order that the relationship between time and the voltage developed across the predominantly capacitive load impedance 4 resulting from the proportional current signals being steered to the predominantly capacitive load impedance 4 is linear.

The value of the voltage reference source 5 is selected to accommodate the expected maximum peak-to-peak value and the time average output of the continuously linearly interpolated analogue voltage output signal developed on the main output terminal 9.

In use, data samples in the form of digital words of the appropriate bit size of the digital input signal are clocked through the input port 10 into the input register 12 at the data sampling rate $f_s$, and in turn are clocked at the data sampling rate into the delay register 14. The subtracting circuit 15 subtracts the data sample in the delay register 14 from the data sample in the input register 12 on each clock cycle of the data sampling rate $f_s$, in order to sequentially produce difference values between the value of the current data sample and the value of the immediately previously received data sample. The data sample in the input register 12 is always the current data sample, while the data sample in the delay register 14 is always the immediately previously received data sample. The difference values from the subtracting circuit 15 are sequentially applied to the DAC register 16 on respective clock cycles of the data sampling rate $f_s$, and the current steering DAC 17 sequentially converts the difference values into the proportional current signals which are steered through the second node 7 to the predominantly capacitive load impedance 4. The continuously linearly interpolated analogue voltage output signal is developed on the main output terminal 9 with respect to ground 8.

Figure 3:
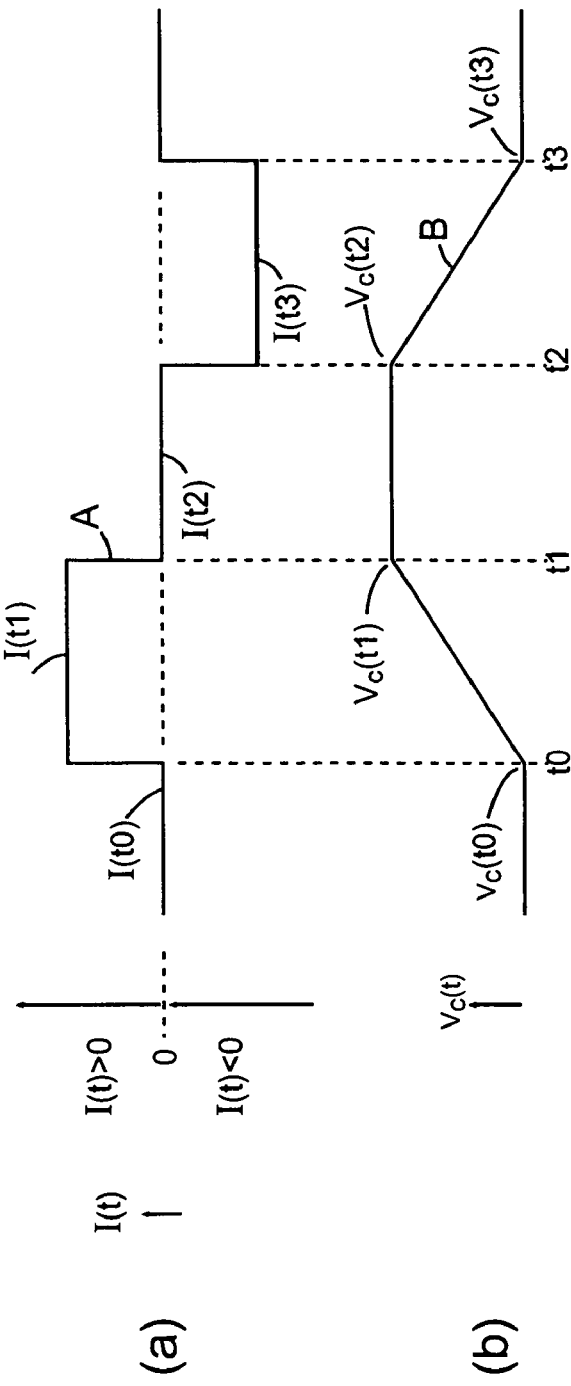

Referring now to FIGS. 3(*a*) and 3(*b*), a more detailed explanation of the development of the continuously linearly interpolated analogue voltage output signal across the predominantly capacitive load impedance 4 will now be described. FIG. 3(*a*) illustrates a waveform A of the proportional current signals steered through the analogue output 18 of the current steering DAC 17 of the DAC 1 during five clock cycles of the data sampling rate $f_s$. FIG. 3(*b*) illustrates a waveform B of the resulting analogue voltage output signal developed across the predominantly capacitive load impedance 4, which is produced on the main output terminal 9 with respect to ground 8 during the same five clock cycles. In both FIGS. 3(*a*) and 3(*b*) time is plotted on the X-axis, and in FIG. 3(*a*) current is plotted on the Y-axis, while in FIG. 3(*b*) voltage is plotted on the Y-axis. During the clock cycle prior to time t0, the proportional current signal I(t0) through the analogue output 18 is zero amps, and the analogue voltage output signal on the main output terminal 9 remains constant at $V_c(t0)$ volts over the clock cycle. At time t0 the proportional current signal through the analogue output 18 becomes a positive flowing current signal of value I(t1), and remains constant at the value I(t1) for one clock cycle from time t0 to time t1. During the clock cycle from time t0 to time t1 the load capacitor C1 is charged by the proportional current signal I(t1), and the analogue voltage output signal on the main output terminal 9 increases linearly from the value $V_c(t0)$ volts at time t0 to $V_c(t1)$ volts at time t1.

At time t1 the proportional current signal I(t2) through the analogue output 18 of the current steering DAC 17 falls to zero amps, and remains at zero amps during the clock cycle from time t1 to time t2. During the clock cycle from time t1 to time t2, since the proportional current signal I(t2) through the analogue output 18 remains at zero amps, the voltage across the load capacitor C1 remains substantially constant, and the analogue voltage output signal on the main output terminal 9 remains substantially constant at $V_c(t1)$ volts. At time t2 the proportional current signal I(t3) through the analogue output 18 of the current steering DAC 17 becomes a negative flowing current signal and remains constant at the value I(t3) during the clock cycle until time t3. The absolute values of the two proportional current signals I(t1) and I(t3) are equal. During the clock cycle from time t2 to time t3 the proportional current signal I(t3) discharges the load capacitor C1 from the voltage $V_c(t1)$ to $V_c(t3)$, and the analogue voltage output signal on the main output terminal 9 decreases linearly from the value $V_c(t2)$ to $V_c(t3)$. Since the absolute values of the proportional current signal I(t1) and I(t3) are equal, the value of the voltage $V_c(t3)$ is equal to the voltage $V_c(t0)$.

At time t3 the proportional current signal I(t4) through the analogue output 18 of the current steering DAC 17 returns to zero amps, and remains at zero amps for the next clock cycle, and the analogue voltage output signal on the main output terminal 9 remains constant at the value $V_c(t3)$. It will of course be appreciated that the analogue voltage output signal at time t3 would have been different to the analogue voltage output signal at time t0 if the absolute values of the two proportional current signals I(t1) and I(t3) were unequal.

Accordingly, the DAC 1 according to the invention provides continuous linear interpolation of the data samples, and the reconstructed analogue voltage output signal on the main output terminal 9 is provided with continuous linear interpolation, and thus is of substantially infinite resolution, and as will be discussed below with reference to FIG. 6, with waveform errors minimised.

Figure 1:
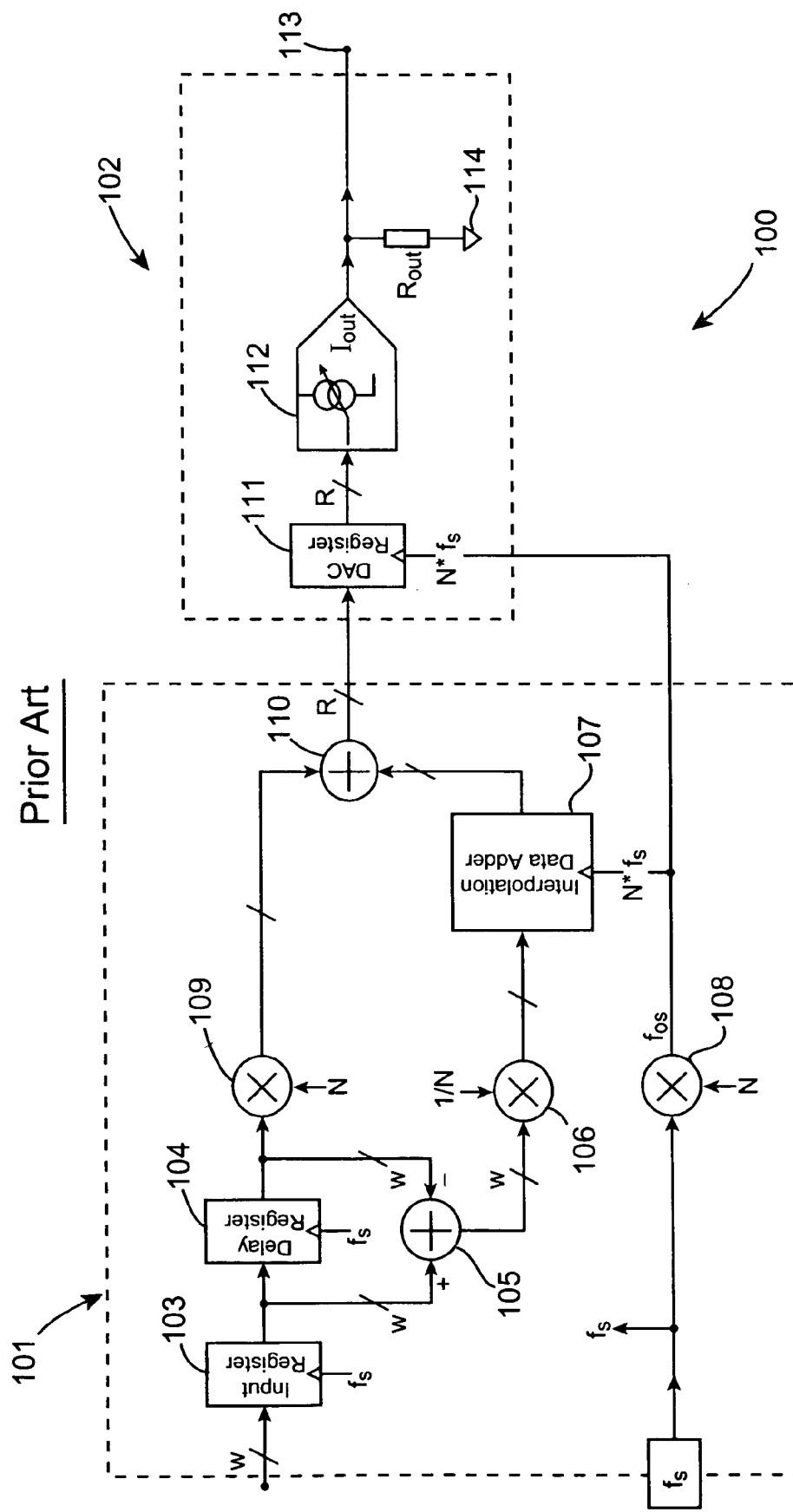
FIG. 1 is a block representation of a prior art DAC for converting a time varying digital input signal comprising consecutive data samples to an analogue voltage output signal with sampled linear interpolation.
Figure 5:
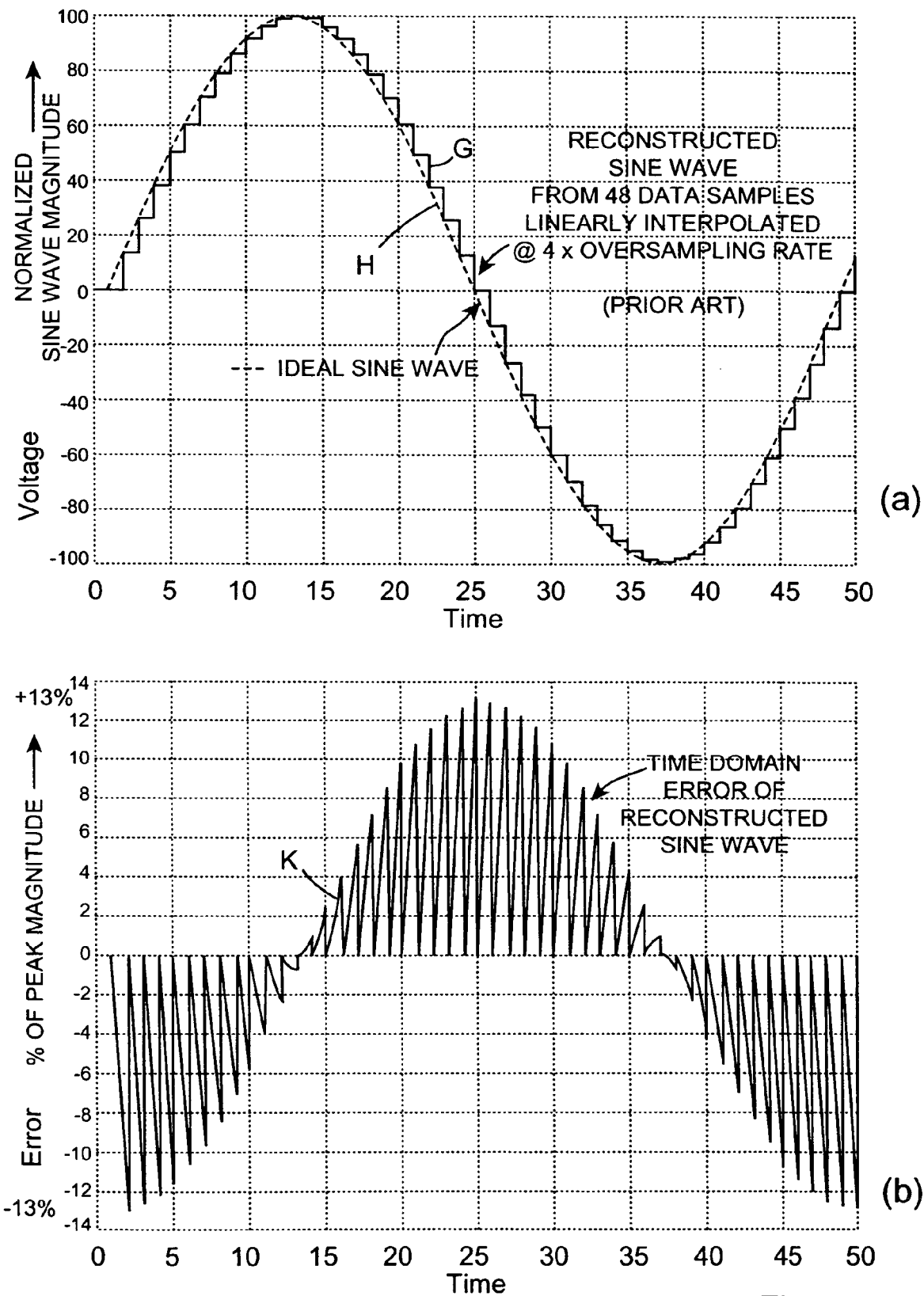

In order to demonstrate the significant improvement in the resolution, and the significant reduction in the waveform errors of the analogue voltage output signal of the DAC 1 according to the invention over the prior art DAC 100 of FIG. 1, a computer simulation of the DAC 1 of FIG. 2 according to the invention and its operation was made, and a computer simulation of the prior art DAC 100 of FIG. 1 was also made, along with two computer simulations of the operation of the prior art DAC 100, one of which included oversampling and the other of which did not. Waveforms representative of the results of the simulations are illustrated in FIGS. 4 to 6. The waveforms of FIGS. 4 and 5 represent the simulations of the operation of the prior art DAC 100, and the waveforms of FIG. 6 represent the simulation of the operation of the DAC 1. In the two simulations of the prior art DAC 100 of FIG. 1 and in the simulation of the DAC 1 according to the invention of FIG. 2, a digital input signal with consecutive data samples representative of a sine wave of 4 MHz was provided to the DACs 1 and 100 at a data sampling rate of 48 MHz. One period of the respective reconstructed analogue sine waves produced by the respective DACs 1 and 100 are illustrated in FIGS. 4(*a*), 5(*a*) and 6(*a*). In FIGS. 4(*a*), 5(*a*) and 6(*a*) time is plotted on the X-axis normalised to 4 MHz, and voltage is plotted on the Y-axis normalised to 100% of the peak to peak value of the reconstructed sine wave. In the first simulation of the prior art DAC 100, the sine wave illustrated in FIG. 4(*a*) was reconstructed at the data sampling rate of 48 MHz without oversampling. The step waveform C of FIG. 4(*a*) represents the reconstructed sine wave, while the waveform D in broken lines represents the ideal sine wave which should have been constructed.

Referring now to FIG. 4(*b*), a waveform E represents time domain waveform errors of the reconstructed sine wave C of FIG. 4(*a*) produced by the prior art DAC 100 without oversampling as a percentage of the peak value of the reconstructed sine wave. Time is plotted on the X-axis of FIG. 4(*b*) in the same units as in FIG. 4(*a*), and the percentage errors are plotted on the Y-axis normalised to the maximum percentage error. At the beginning of the first clock cycle of the data sampling rate when the value of the reconstructed waveform is zero volts, the time domain waveform error is 0%. However, the time domain waveform error increases linearly to a maximum of −50% of the peak value just before the end of the first clock cycle. At the beginning of the second clock cycle the time domain waveform error returns to 0%, and increases substantially linearly to approximately −35% of the peak value just before the end of the second clock cycle, and so on until the beginning of the fourth clock cycle when the time domain waveform error returns to zero from approximately −13% of the peak value at the end of the third clock cycle. At the end of the fourth clock cycle the time domain waveform error increases to approximately 13% of the peak value. At the end of the sixth and seventh clock cycles the time domain waveform error reaches 50% of the peak value of the reconstructed sine wave, and at the end of the twelfth clock cycle, namely, at the end of a period of the reconstructed sine wave, the time domain waveform error is at −50% of the peak value. In other words, the maximum waveform error occurs on either side of the zero value of the reconstructed sine wave. Accordingly, the waveform errors in the reconstructed sine wave produced by the prior art DAC 100 without oversampling are up to 50% of the peak values of the reconstructed sine wave.

In the second simulation of the prior art DAC 100 of FIG. 1, the 4 MHz sine wave at the data sampling rate of 48 MHz was oversampled by an oversampling factor of four, in other words, the oversampling rate was 192 MHz. One period of the reconstructed sine wave is illustrated in FIG. 5(*a*) by the step waveform G. The waveform H in broken lines represents the ideal sine wave which should have been constructed. Time is plotted on the X-axis normalised to 4 MHz, and voltage is plotted on the Y-axis normalised to 100% of the peak to peak value of the reconstructed sine wave.

The time domain waveform errors of the reconstructed sine wave are represented by the waveform K of FIG. 5(*b*) as a percentage of the peak value of the reconstructed sine wave. Time is plotted on the X-axis in the same units as those of FIG. 5(*a*), and the percentage error is plotted on the Y-axis normalised to the maximum percentage error. In this case the maximum time domain waveform errors are −13% and +13% of the peak value of the reconstructed sine wave. The errors of −13% occur at the end of the first and forty-eighth clock cycles at the oversampling rate, and the errors of 13% occur at the ends of the twenty-fourth and the twenty-fifth clock cycles. In other words, the maximum waveform errors occur on either side of the zero values of the reconstructed sine wave.

In the simulation of the DAC 1 of FIG. 2 according to the invention, the sine wave of. 4 MHz at a data sampling rate of 48 MHz was provided to the digital input port 10 of the DAC 1, and the reconstructed sine wave was produced with no oversampling on the main output terminal 9. One period of the reconstructed sine wave is illustrated by the waveform L of FIG. 6(*a*). The waveform M in broken lines of FIG. 6(*a*) represents the ideal sine wave which should have been constructed. Time is plotted on the X-axis of FIG. 6(*a*) normalised to 4 MHz, and voltage is plotted on the Y-axis normalised to 100% of the peak to peak value of the reconstructed sine wave.

As can be seen, the reconstructed sine wave L is a continuously linearly interpolated approximation of the ideal sine wave with waveform errors minimised.

Figure 6:
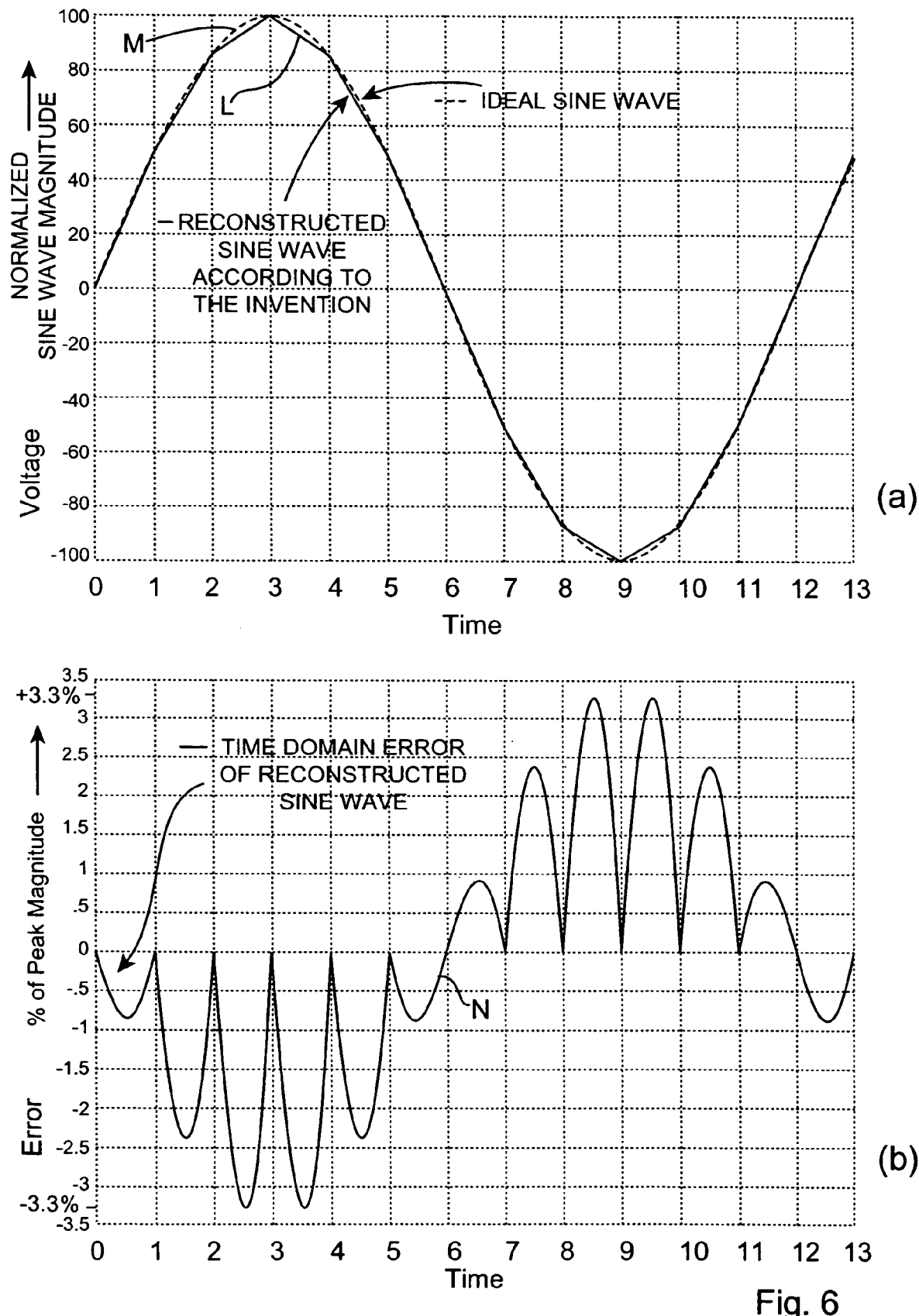
FIG. 6(a) is a graphical representation of a reconstructed analogue voltage sine waveform produced by the DAC according to the invention of FIG. 2.
FIG. 6(b) is a graphical representation of waveform errors in the reconstructed waveform of FIG. 6(a)

The waveform N of FIG. 6(*b*) represents the time domain waveform errors in the reconstructed sine wave L of FIG. 6(*a*) as a percentage of the peak value of the reconstructed sine wave. Time is plotted on the X-axis of FIG. 6(*b*) in the same units as time is plotted on the X-axis of FIG. 6(*a*). The percentage error is plotted on the Y-axis normalised to the maximum percentage error. As can be seen from the waveform N, the time domain waveform errors in the reconstructed sine wave are significantly reduced by the DAC 1 of FIG. 2. The maximum time domain waveform errors are −3.3% and +3.3% of the peak value of the reconstructed sine wave. The maximum errors of −3.3% and +3.3% of the value of the ideal sine wave occur within one clock cycle of the data sampling rate on either side of the maximum and minimum values of the reconstructed sine wave, in other words, midway between the third, fourth, ninth and tenth clock cycles of the data sampling rate $f_s$. The waveform errors in the sine wave L reduce to zero at the beginning and end of each clock cycle, and the minimum waveform errors during the clock cycles are less than 1% and −1% on the clock cycles before and after the respective zero values of the sine wave L.

Accordingly, the continuous linear interpolation with substantially infinite resolution of the reconstructed sine wave produced by the DAC 1 of FIG. 2 and the significant reduction in waveform errors in the reconstructed sine wave is achieved without oversampling, and with no increase in the resolution of the DAC 1. This compares particularly favourably with the maximum waveform errors of 50% of the peak values of the reconstructed sine wave obtained from the prior art DAC 100 when operated without oversampling, and also compares favourably with the maximum waveform errors of 13% of the peak values of the reconstructed sine wave obtained from the prior art DAC 100 with oversampling by an oversampling factor of four.

Figure 7:
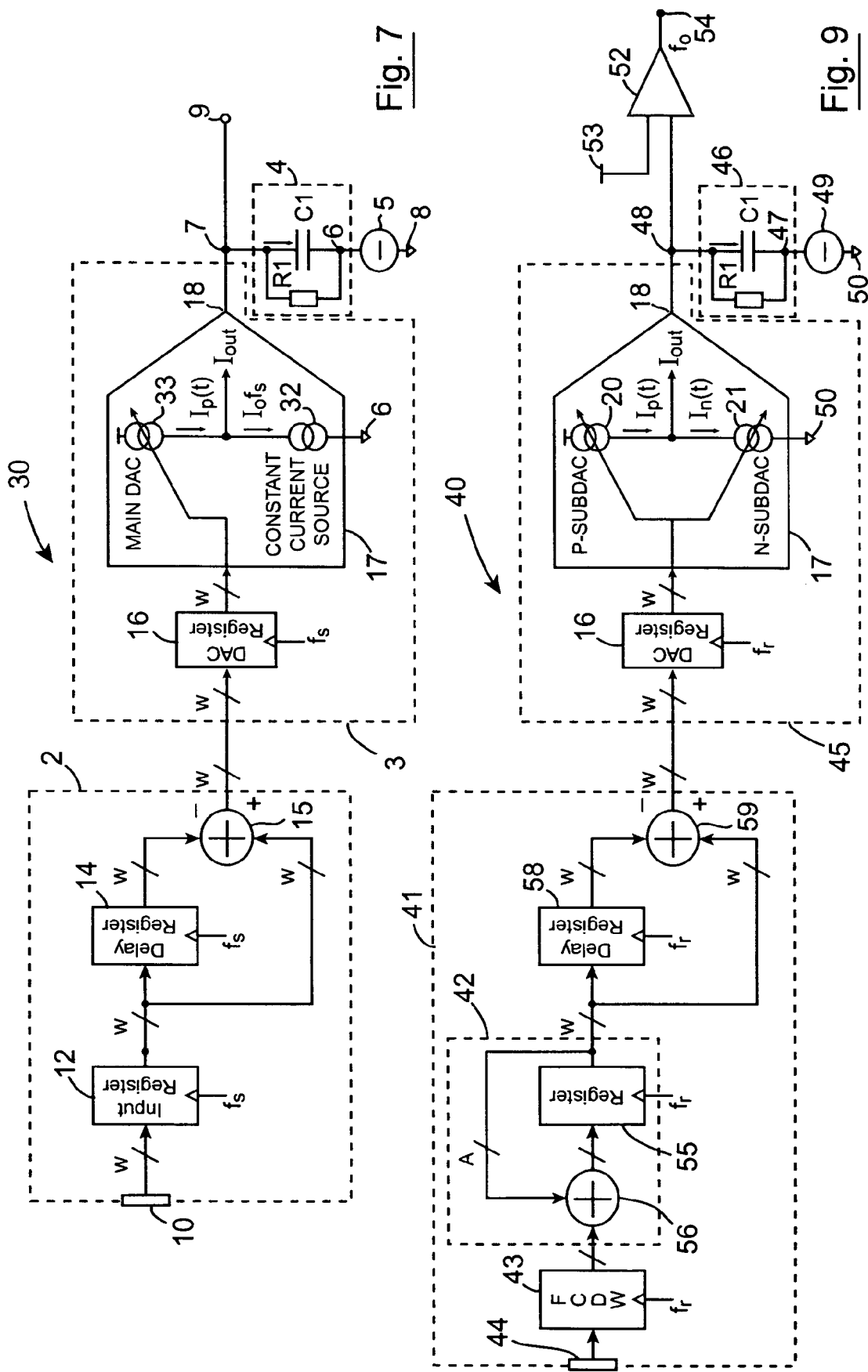
FIG. 7 is a block representation of a DAC according to another embodiment of the invention.
Figure 8:
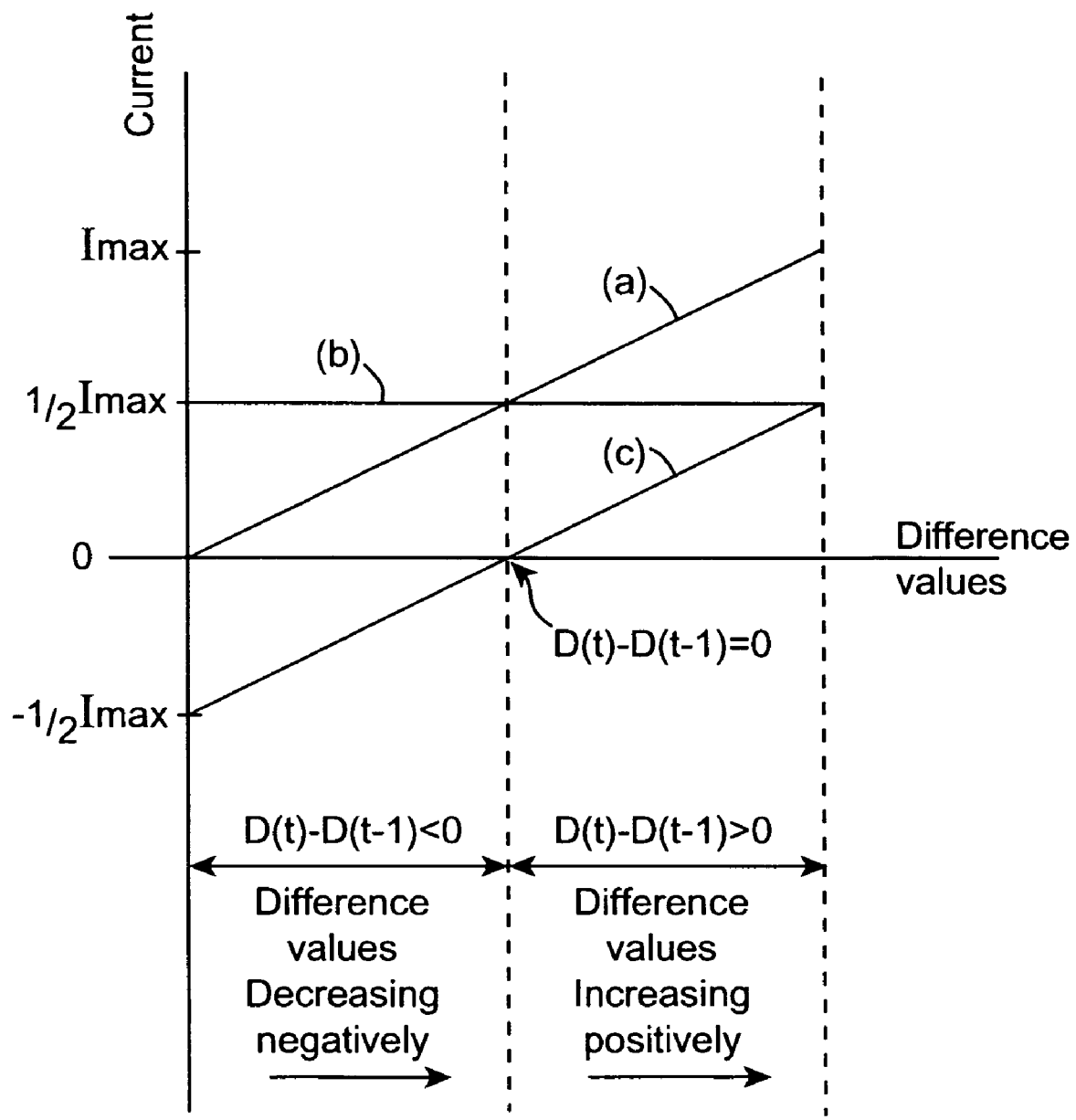
FIG. 8 is a graphical representation of electrical currents produced by a current steering DAC of the DAC of FIG. 7.

Referring now to FIGS. 7 and 8, there is illustrated a DAC according to another embodiment of the invention indicated generally by the reference numeral 30. The DAC 30 is substantially similar to the DAC 1 and similar components are identified by the same reference numerals. The digital signal processing circuit 2 of the DAC 30 is similar to the digital signal processing circuit 2 of the DAC 1. The main difference between the DAC 30 and the DAC 1 is in the current steering DAC 17. In this embodiment of the invention the current steering DAC 17 is provided with binary offset coding, and comprises a constant offset current source 32, and a variable current source 33. The constant offset current source 32 sinks a constant offset current of $\frac{1}{2} I_{max}$, while the variable current source 33 produces proportional current signals up to a maximum value of $I_{max}$ in response to the difference values applied to the DAC register 16. The maximum positive difference value results in a maximum current of $I_{max}$ being produced by the variable current source 33, and the maximum negative difference value results in a zero current being produced by the variable current source 33. A zero difference value results in a current of $\frac{1}{2} I_{max}$ being produced by the variable current source 33. By virtue of the fact that the constant offset current source 32 sinks a constant current of $\frac{1}{2} I_{max}$, the current steering DAC 17 is configured with a transfer function such that the maximum positive difference value results in a positive flowing current of $\frac{1}{2} I_{max}$ being steered through the analogue output 18 from the current steering DAC 17 to the predominantly capacitive load impedance 4, while the maximum negative difference value results in a negative flowing current of $\frac{1}{2} I_{max}$ being steered through the analogue output 18 of the current steering DAC 17 from the predominantly capacitive load impedance 4 into the current steering DAC 17. A difference value of zero results in a zero current being steered through the analogue output 18 of the current steering DAC 17.

Referring now in particular to FIG. 8, a graphical representation of the currents produced by the variable current source 33 and the constant offset current source 32, as well as the current which is steered through the output 18 of the current steering DAC 17 are illustrated plotted against difference values. Current is plotted on the Y-axis of FIG. 8 against difference values on the X-axis. The graph (a) of FIG. 8 represents the current $I_p$ produced by the variable current source 33, which is always positive, and is represented increasing from a value of zero current to the current $I_{max}$, as the difference values increase from the maximum negative value through zero to the maximum positive value. The graph (b) represents the constant offset current $I_{os}$ produced by the constant offset current source 32, which is of constant value of $\frac{1}{2} I_{max}$. The variable current $I_p$ produced by the variable current source 33 is always positive with respect to the output 18 of the current steering DAC 17, while the constant offset current $I_{os}$ is always negative with respect to the output 18.

The graph (c) of FIG. 8 represents the current $I_c$ which is the proportional current steered through the output 18 of the current steering DAC 17 in response to the difference values.

Accordingly, the proportional current $I_c$ at time t, namely, $I_c(t)$ which is steered through the output 18 in response to a difference value ΔD between a data word D(t) received at time t and the previously received data word D(t-1) is given by the equation:

$$I_c(t) = I_p(t) - I_{os}$$

Accordingly, proportional currents corresponding to negative difference values are produced by the variable current $I_p$ when the value of the variable current $I_p$ lies between zero and $\frac{1}{2} I_{max}$, negative difference values of decreasing magnitude being represented by increasing values of the variable current $I_p$. Proportional currents corresponding to positive difference values are produced by the variable current $I_p$ when the value of the variable current $I_p$ lies between $\frac{1}{2} I_{max}$ and $I_{max}$, positive difference values of increasing magnitude being represented by increasing values of the variable current $I_p$. A difference value of zero is represented by the variable current $I_p$ being of value $\frac{1}{2} I_{max}$.

Otherwise, the DAC 30 and its operation are similar to the DAC 1 already described with reference to FIG. 2.

Figure 10:
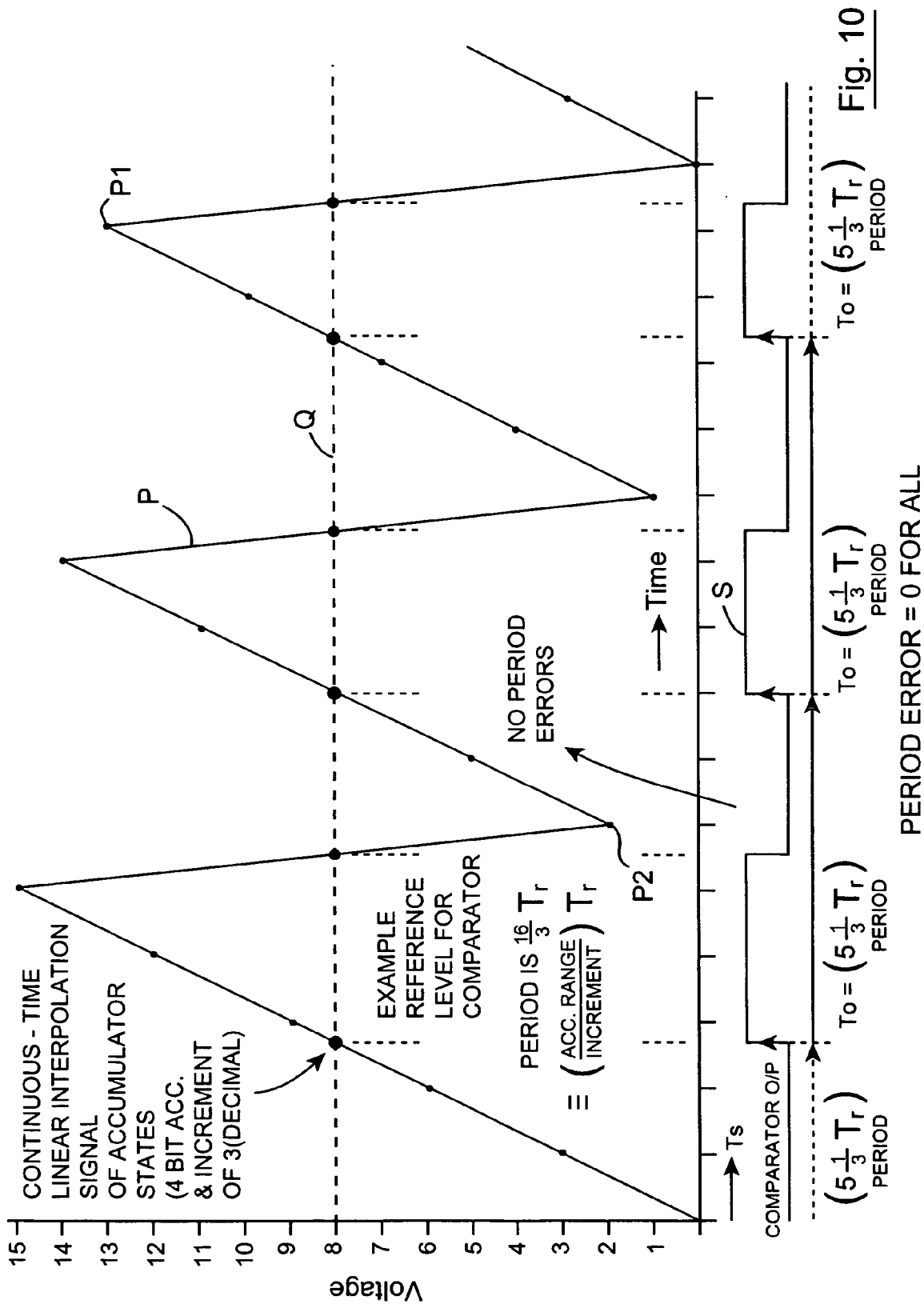

Referring now to FIGS. 9 and 10, there is illustrated a frequency synthesiser according to the invention, indicated generally by the reference numeral 40, for synthesising an output signal of frequency $f_0$ from a reference frequency $f_r$ applied to the synthesiser 40. The frequency synthesiser 40 comprises a digital signal processing circuit 41, which comprises a modulo-M accumulator 42 for accumulating on each clock cycle of the reference frequency $f_r$ a first digital word, which is stored in an input register 43 in the digital signal processing circuit 41. The first digital word is representative of the value of the numerator of a fractional factor by which the reference frequency $f_r$ is to be multiplied to produce the synthesised output frequency $f_0$. The modulus M of the accumulator 42 is representative of the value of the denominator of the fractional factor. The first digital word is selectable, and is written to the input register 43 through a digital input port 44, which may be a parallel or a serial port.

The digital signal processing circuit 41, as will be described below, sequentially determines difference values between the consecutive accumulated values of the first digital word produced by the accumulator 42 on respective clock cycles of the reference frequency $f_r$. The difference values are sequentially applied to a current steering DAC circuit 45 on the respective clock cycles of the reference frequency $f_r$, and are sequentially converted into proportional analogue current signals by the current steering DAC circuit 45. The current steering DAC circuit 45 is similar to the current steering DAC circuit 3 of the DAC 1 of FIG. 2, and similar components are identified by the same reference numerals as those used in the current steering DAC circuit 3 of the DAC 1. A predominantly capacitive load impedance 46 which is similar to the predominantly capacitive load impedance 4 of the DAC 1 of FIG. 2 is coupled between first and second nodes 47 and 48, and is coupled to a voltage reference source 49 through the first node 47. The voltage reference source 49 is similar to the voltage reference source 5 of the DAC 1 of FIG. 2, and is coupled to ground 50.

The proportional current signals are sequentially steered by the current steering DAC circuit 45 through the second node 48 to the predominantly capacitive load impedance 46 for integration thereof for developing a continuously linearly interpolated analogue voltage signal on the second node 48, which is representative of the accumulated values of the first digital word produced by the accumulator 42. A graphical representation of the continuously linearly interpolated analogue voltage signal produced on the second node 48 is illustrated by the waveform P of FIG. 10, and is described in detail below.

A comparator 52 compares the analogue voltage signal on the second node 48 with a reference voltage level signal applied to a reference terminal 53, and produces a logic signal at the synthesised output frequency $f_O$ as will be described in more detail below with reference to FIG. 10 on an output frequency terminal 54. The reference voltage level signal is illustrated by the broken line Q in FIG. 10. A waveform S, which is also illustrated in FIG. 10, is a graphical representation of the logic signal produced by the comparator 52 on the output frequency terminal 54 at the synthesised frequency $f_O$. The synthesised frequency is synthesised with a constant period $T_O$, and is thus synthesised without jitter. The value of the reference voltage level signal is not critical, however, it should be of value intermediate the value of the minimum positive peak voltage of the analogue voltage signal produced on the second node 48 relative to a time average voltage of the analogue voltage signal on the node 48 and the value of the minimum negative peak voltage thereof relative to the time average voltage of the analogue voltage signal, namely, between the minimum positive peak P1 of the waveform P of FIG. 10 and the minimum negative peak P2. Preferably, the value of the reference voltage level signal should approximate to the average of the minimum positive peak voltage P1 and the minimum negative peak voltage P2 of the analogue voltage signal on the second node 48.

Returning now to the digital signal processing circuit 41, the accumulator 42 comprises an N bit accumulating register 55, the number N of bits of the accumulating register 55 being selected to determine the modulus M of the accumulator 42. An adder 56 adds the first digital word which is stored in the input register 43 with the accumulated value of the first digital word accumulated in the accumulating register 55 on each clock cycle of the reference frequency $f_r$, and the new accumulated value is written to the accumulating register 55.

A delay register 58, which is similar to the delay register 14 of the digital signal processing circuit 2 of the DAC 1 of FIG. 2 stores each accumulated value of the first digital word produced by the accumulator 42 for one clock cycle of the reference frequency $f_r$. A subtracting circuit 59 similar to the subtracting circuit 15 of the digital signal processing circuit 2 of the DAC 1 sequentially subtracts the accumulated values of the first digital word stored in the delay register 58 from the current accumulated values of the first digital word produced by the accumulator 42 on respective clock cycles of the reference frequency $f_r$ for sequentially producing the difference values between the consecutive accumulated values of the first digital word produced by the accumulator 42. The difference values are sequentially applied to the DAC register 16 of the current steering DAC circuit 45 on respective clock cycles of the reference frequency $f_r$.

The difference values of the consecutive accumulated values of the first digital word produced by the accumulator 42 on the respective clock cycles of the reference frequency $f_r$ as the accumulated values are increasing are equal to the first digital word. In other words, on each clock cycle of the reference frequency $f_r$, while the accumulator 42 is in a non-overflow state, the difference value determined by the digital processing circuit 41 and applied to the DAC register 16 of the current steering DAC circuit 45 is equal to the first digital word. However, on each clock cycle when the accumulator 42 overflows, in other words, when the accumulator 42 is in an overflow state, the difference value of the consecutive accumulated values of the first digital word determined by the digital signal processing circuit 41 is equal to a second digital word, which is representative of the negative value of the difference of modulus M of the accumulator 42 less the numerator of the fractional factor, in other words, the negative value of the difference of the modulus M less the value of the first digital word. Accordingly, as will be described with reference to FIG. 11, a frequency synthesiser with a simplified version of the digital signal processing circuit 41 can be provided making use of this fact.

Referring again to FIG. 10, an example of the operation of the frequency synthesiser 40 will now be described. In this case the accumulating register 55 of the accumulator 42 is a four bit register, thus providing the accumulator 42 with a modulus the value of which is $2^4$, namely, decimal value 16. In this particular example the numerator of the fractional factor by which the reference frequency is to be multiplied to produce the synthesised frequency on the output frequency terminal 54 is selected to be decimal value 3. Thus, the fractional factor by which the reference frequency is to be multiplied to produce the synthesised frequency $f_O$ is the decimal fraction 3/16, and thus the first digital word is selected to be of value equal to decimal 3. As discussed above, the waveform P represents the analogue voltage signal developed on the second node 48 of the frequency synthesiser 40 with reference to ground 50. The reference voltage level signal on the reference terminal 53 represented by the broken line Q with which the analogue voltage signal P on the second node 48 is compared by the comparator 52 is selected to be of value equal to approximately the average of the minimum positive peak voltage value P1 and the minimum negative peak voltage value P2 of the analogue voltage signal P, namely, the average of the voltages of the minimum positive peak P2 and the minimum negative peak P1 of the waveform P. In this case the minimum positive peak voltage P2 is 13 volts, and the minimum negative peak voltage P1 is 2 volts, and thus the value of the reference voltage level signal Q is selected to be 8 volts, which is just greater than the average value of 7.5 volts. On each transition of the analogue voltage signal P on the second node 48 across the reference voltage level signal Q when the accumulator 42 is in the non-overflow state, the output of the comparator 52 on the output frequency terminal 54 transitions from a logic low state to a logic high state, and on each transition of the analogue voltage signal P on the second node 48 across the reference voltage level signal Q when the accumulator 42 is in the overflow state, the output of the comparator 52 on the output frequency terminal 54 transitions from the logic high to the logic low state, see the waveform S which is representative of the logic signal produced by the comparator 52 on the output frequency terminal 54 at the synthesised output frequency $f_O$.

The period $T_O$ between successive transitions of the analogue voltage signal P across the reference voltage level signal Q when the accumulator 42 is in the non-overflow state is constant at 5⅓ times the period $T_r$ of the reference frequency $f_r$, and accordingly, the period $T_O$ of the logic signal S produced by the comparator 52 on the output frequency terminal 54 from one rising edge to the next rising edge of the logic signal S, which provides the synthesised output frequency $f_O$ is similarly constant between the rising edges of the logic signal at 5⅓ times the period $T_r$ of the reference frequency $f_r$. Thus, the synthesised output frequency $f_O$ appearing on the output frequency terminal 54 is free of jitter and is of frequency 3/16 times the reference frequency $f_r$.

The period between successive transitions of the analogue voltage signal P across the reference voltage level signal Q when the accumulator 42 is in the overflow state is variable. However, this does not affect the jitterless status of the synthesised output frequency $f_0$, provided the clock edges of the synthesised frequency $f_0$ are determined from the edges of the logic signal S on the output frequency terminal 54, which correspond to the successive transitions of the analogue voltage signal P on the second node 48 across the reference voltage level signal Q when the accumulator 42 is in the non-overflow state, in this case the rising edges of the logic signal S.

In use, the first digital word representative of the numerator of the fractional factor by which the reference frequency $f_r$ is to be multiplied to produce the synthesised output frequency $f_0$ is written to the input register 43 through the digital input port 44. The digital signal processing circuit 41 sequentially determines the difference values of the consecutive accumulated values of the first digital word produced by the accumulator 42 on the respective clock cycles of the reference frequency $f_r$, and the difference values are sequentially applied to the DAC register 16 on the respective clock cycles of the reference frequency $f_r$. The current steering DAC circuit 45 sequentially converts the difference values written to the DAC register 16 to the proportional current signals, which are sequentially steered to the predominantly capacitive load 46 for producing the continuously linearly interpolated analogue voltage signal on the second node 48. The analogue voltage signal on the second node 48 is compared with the reference voltage level signal on the reference terminal 53 by the comparator 52, which in turn outputs the logic signal S at the synthesised output frequency $f_0$ on the output frequency terminal 54.

Figure 11:
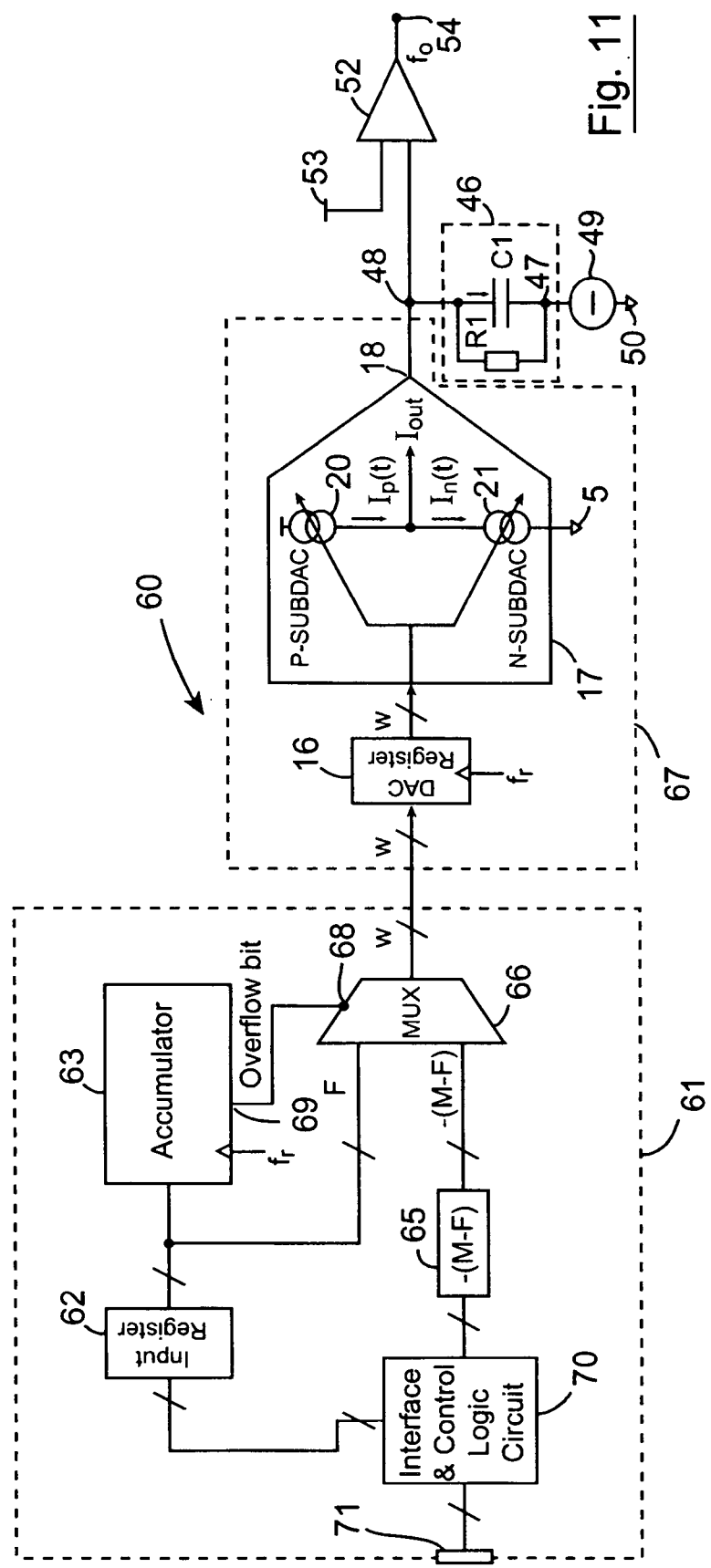
FIG. 11 is a block representation of a frequency synthesiser according to another embodiment of the invention.

Referring now to FIG. 11, there is illustrated a frequency synthesiser according to another embodiment of the invention, indicated generally by the reference numeral 60, also for synthesising an output frequency $f_0$ from a reference frequency $f_r$ applied to the frequency synthesiser 60. The frequency synthesiser 60 is substantially similar to the frequency synthesiser 40 described with reference to FIGS. 9 and 10, and similar components are identified by the same reference numerals. The main difference between the frequency synthesiser 60 and the frequency synthesiser 40 is in the digital signal processing circuit.

In this embodiment of the invention the frequency synthesiser 60 comprises a digital signal processing circuit 61, which comprises an input register 62 and a modulo M accumulator 63, which are similar to the input register 43 and the accumulator 42 of the frequency synthesiser 40, and the input register 62 stores the first digital word which represents the numerator of the fractional factor by which the reference frequency $f_r$ is to be multiplied. The accumulator 63 sequentially accumulates the first digital word on the respective clock cycles of the reference frequency $f_r$. However, in this case the difference values between the consecutive accumulated values of the first digital word produced by the accumulator 63 are not computed by the digital signal processing circuit 61. Rather, since the difference values between the consecutive accumulated values of the first digital word produced by the accumulator 63 result in only two difference values being produced, the two difference values are stored. One of the difference values being the first digital word is already stored in the input register 62, which acts as a first digital word storing register. The other of the difference values is stored as a second digital word in a second digital word storing register 65. The value of the second digital word is the negative value of the difference of the modulus M of the accumulator 63 less the first digital word.

A multiplexer 66 in the digital signal processing circuit 61 is responsive to the state of the accumulator 63 for selectively and alternately coupling the input register 62 and the second digital word storing register 65 to a current steering DAC circuit 67 for selectively and alternately applying one of the first and second digital words to the current steering DAC circuit 67. The current steering DAC 67 is similar to the current steering DAC circuit 45 of the frequency synthesiser 40. A control port 68 of the multiplexer 66 is coupled to an overflow output 69 of the accumulator 63. The multiplexer 66 is responsive to an overflow bit from the overflow output 69 of the accumulator 63 being indicative of the accumulator 63 being in the non-overflow state, for coupling the input register 62 to the current steering DAC circuit 67 for applying the first digital word from the input register 62 to the DAC register 16 on each clock cycle of the reference frequency $f_r$, when the accumulator 63 is in the non-overflow state, and the multiplexer 66 is responsive to the overflow bit of the accumulator 63 being indicative of the accumulator 63 being in the overflow state, for coupling the second digital word storing register 65 to the current steering DAC circuit 67 for applying the second digital word to the DAC register 16 on each clock cycle of the reference frequency $f_r$, when the accumulator 63 is in the overflow state.

An interface control logic circuit 70 receives the first digital word through an input port 71, which may be a serial or parallel port, and the interface and control logic circuit 70 writes the first digital word to the input register 62, and computes the second digital word by subtracting the first digital word from the modulus M of the accumulator 63, and then writes the negative value of the difference of the modulus M of the accumulator 63 and the first digital word to the second digital word storing register 65.

In this embodiment of the invention since computation of the difference values between the consecutive accumulated values of the first digital word is not required, the accumulated values of the first digital word from the accumulator 63 are not required, and thus only the overflow output from the accumulator 63 is required in this embodiment of the invention.

Otherwise, the frequency synthesiser 60 is similar to the frequency synthesiser 40 and its operation is likewise similar, and the synthesised output frequency is provided on the output frequency terminal 54.

Figure 12:
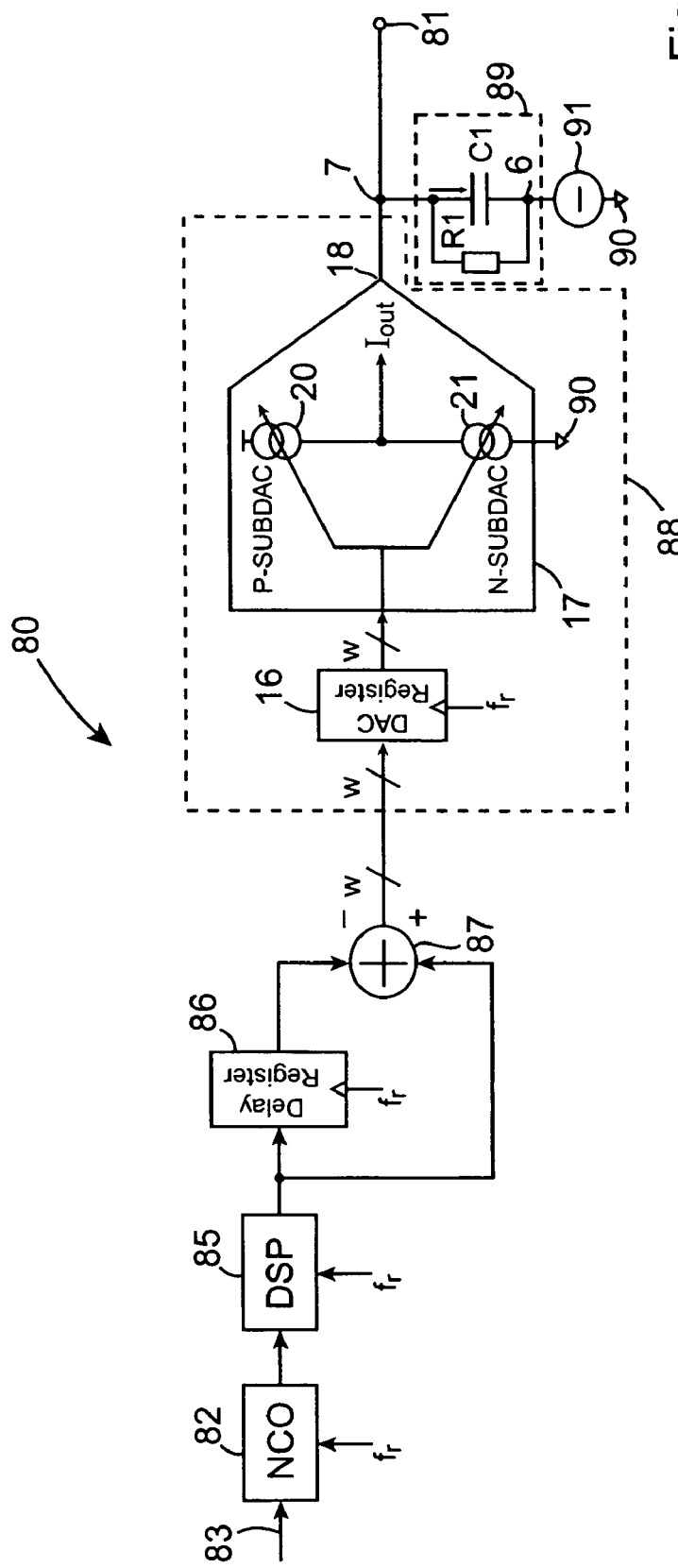
FIG. 12 is a block representation of a direct digital synthesiser also according to the invention.

Referring now to FIG. 12, there is illustrated a direct digital frequency synthesiser also according to the invention, which is indicated generally by the reference numeral 80, for synthesising an output signal of output frequency $f_0$ from a reference frequency $f_r$, and producing the output signal on an output terminal 81 of the direct digital frequency synthesiser 80. The synthesised output signal is produced with continuous linear interpolation, and thus is produced with substantially infinite resolution. In this embodiment of the invention the synthesised output signal produced on the output terminal 81 is of frequency $f_o$, in the form of a sine wave, although, needless to say, the synthesised output signal of frequency $f_0$ may be provided in the form of any desired oscillating waveform.

The direct digital synthesiser 80 comprises a numerical controlled oscillator 82, which is clocked at the reference frequency $f_r$, and sequentially produces phase determining digital words on respective clock cycles of the reference frequency $f_r$, which are representative of the phase of the synthesised output signal, in response to a frequency control digital word applied to an input 83 thereof. A digital signal processing circuit 85 sequentially converts the phase determining digital words produced by the numerical controlled oscillator 82 at the reference frequency $f_r$ to respective digital words representative of the phase dependent magnitude of the sine wave of the output signal.

The digital words produced by the digital signal processing circuit 85 are sequentially applied at the reference frequency $f_r$ to a delay register 86, which is similar to the delay register 14 of the DAC 1 of FIG. 2, and the digital words from the digital signal processing circuit 85 are stored in the delay register 86 for one clock cycle. A subtracting circuit 87, which is similar to the subtracting circuit 15 of the DAC 1 of FIG. 2, sequentially subtracts the digital word previously produced by the digital signal processing circuit 85, which is the digital word stored in the delay register 86, from the current value of the digital word produced by the digital signal processing circuit 85 on each clock cycle of the reference frequency $f_r$ to produce difference values between the current values of the digital words produced by the digital signal processing circuit 85 and the previously produced digital word.

The difference values produced by the subtracting circuit 85 are applied to a current steering DAC circuit 88 on respective clock cycles of the reference frequency $f_r$, which converts the difference values to proportional current signals, which are proportional to the respective difference values. The proportional current signals are steered to a predominantly capacitive load impedance 89 for developing the sine wave of the synthesised output signal on the output terminal 81. The current steering DAC circuit 88 is similar to the current steering DAC circuit 3 of the DAC 1 of FIG. 2, and the predominantly capacitive load impedance 89 is similar to the predominantly capacitive load impedance 4 of the DAC 1 of FIG. 2, and accordingly, similar components are identified by the same reference numerals. The first node 6 of the predominantly capacitive load impedance 89 is coupled to ground 90 through a voltage reference source 91, which is similar to the voltage reference source 5 of the DAC of FIG. 2, and the second node 7 of the predominantly capacitive load impedance 89 is coupled to an output 18 of the current steering DAC 17 of the current steering DAC circuit 88. The synthesised output signal of frequency $f_o$ in the form of a sine wave is developed on the output terminal 81 with reference to ground 90.

In this embodiment of the invention the numerical controlled oscillator 82 is implemented as a modulo M accumulator which accumulates the frequency control digital word applied thereto on respective clock cycles of the reference frequency to the value of the modulus M of the accumulator.

In use, the frequency control digital word to produce the synthesised output signal at the desired output frequency $f_o$ is selected and applied to the numerical controlled oscillator 82 which sequentially outputs the phase determining digital words representative of the phase of the synthesised output signal, which is applied at the reference frequency $f_r$ to the digital signal processing circuit 85. The digital signal processing circuit 85 sequentially converts the phase determining digital words on respective clock cycles of the reference frequency $f_r$ to respective digital words which are representative of the phase dependent magnitude of the synthesised output signal of frequency $f_0$, which is to be produced on the output terminal 81. The subtracting circuit 87 sequentially determines difference values between the current value of the digital words outputted by the digital signal processing circuit 85 and the previous digital word stored in the delay register 86 on respective clock cycles of the reference frequency $f_r$, and the difference values are applied from the subtracting circuit 87 to the current steering DAC circuit 88 on respective clock cycles of the reference frequency $f_r$. Proportional currents, which are proportional to the difference values produced by the subtracting circuit 87, are steered through the output 18 of the current steering DAC 17 to the predominantly capacitive load impedance 89 for developing the synthesised output signal of frequency $f_O$ in the form of a sine wave with continuous linear interpolation on the output terminal 81 with reference to ground 90. Since the direct digital synthesiser 80 produces the synthesised output signal in the form of a sine wave with continuous linear interpolation, the synthesised output signal is produced with substantially infinite resolution and with reduced spectral image frequencies.

The prior art DAC described with reference to FIG. 1 and the DACs according to the invention described with reference to FIGS. 2 and 7 have been illustrated in the drawings in order to simplify the description of the invention, and accordingly, for simplicity, control logic circuits, interface circuits, input/output interface circuits, power supplies and other relevant circuits have been omitted. However, it will be readily apparent to those skilled in the art that such circuits will be required, and their implementation will likewise be readily apparent and well known to those skilled in the art. Similarly, it will be appreciated that logic control circuits, interface circuits, input/output interface circuits, power supply circuits and other relevant circuits will be required for the frequency synthesisers described with reference to FIGS. 9 and 11, and the direct digital synthesiser described with reference to FIG. 12, and such additional circuitry and its implementation will be well known to those skilled in the art.

While particular implementations of the DACs according to the invention have been described with reference to FIGS. 2 and 7, it will be readily apparent to those skilled in the art that many other implementations of the DACs may be provided. While the DACs of FIGS. 2 and 7 have been described as comprising specific types of current steering DACs, it will be readily apparent to those skilled in the art that any other suitable current steering DACs may be used.

It will also be appreciated that while the DACs according to the invention of FIGS. 2 and 7 have been described for converting a digital input signal representative of a sine wave into an analogue reconstruction of the sine wave, the DACs according to the invention may be used for converting any other time varying oscillating digital input signal to an analogue voltage output signal with continuous linear interpolation. Additionally, it is envisaged that the DACs according to the invention may also be used for converting an arbitrary digital input signal to an analogue voltage output signal with continuous linear interpolation. Further, while the DACs according to the invention of FIGS. 2 and 7 have been described for converting digital input signals comprising consecutive data samples at specific data sampling rates, the data samples may be provided at any desired sampling rate.

Additionally, while the difference values have been determined between consecutive data samples of the digital input signal supplied to the DACs according to the invention of FIGS. 2 and 7, it will be readily apparent to those skilled in the art that it is not necessary that difference values be determined between consecutive data samples. For example, difference values may be determined between every second data sample, or indeed, between every third or more data samples. However, the greater the frequency with which difference values of the data samples are determined, the more accurate will be the waveform of the reconstructed analogue voltage output signal, and waveform errors in the analogue voltage output signal will be minimised. In other words, by determining difference values between the consecutive data samples, the analogue voltage output signal will be most accurate.

Additionally, it will be appreciated that while the frequency synthesisers according to the invention described with reference to FIGS. 9 to 11 and the direct digital synthesiser described with reference to FIG. 12 have been described with specific signal processing circuits and specific current steering DAC circuits, other suitable digital signal processing circuits as well as other suitable current steering DAC circuits may be provided. Needless to say, the modulus M of the accumulator will be selected to represent the denominator of the fraction by which the reference frequency is to be multiplied to produce the synthesised frequency. Indeed, in certain implementations of the frequency synthesiser according to the invention, it is envisaged that the modulus M of the accumulator may be selectable. For example, by implementing the accumulator in software, the modulus of the accumulator would be selectable.

While the frequency synthesisers according to the invention described with reference to FIGS. 9 to 11 have been described for producing an output frequency of specific value from a reference frequency of specific value, it will be readily apparent to those skilled in the art that the frequency synthesisers according to the invention may be used to produce any output frequency from any reference frequency. The output frequency is determined by the fractional factor by which the reference frequency is divided, and by varying the reference frequency, further variations in the output frequency may be obtained.

While in the DACs described with reference to FIGS. 2 and 7, the frequency synthesiser described with reference to FIG. 8, and the direct digital synthesiser described with reference to FIG. 12, the difference values have been determined by subtracting the previous data sample from the current data sample, it will be readily apparent to those skilled in the art that the difference values may be determined by subtracting the current value from the previous value.

The invention claimed is:

1. A method for converting a time varying digital input signal comprising consecutive data samples to a continuously linearly interpolated analogue voltage output signal, the method comprising:

sequentially providing difference values between at least some of the data samples and respective prior data samples of the digital input signal, sequentially converting the difference values into respective corresponding analogue proportional current signals of current values proportional to the corresponding difference values, and sequentially steering the proportional current signals to a predominantly capacitive load impedance for respective time periods, the durations of which correspond to the time periods between the data samples, the corresponding difference values of which are provided, for integrating the proportional current signals to develop the continuously linearly interpolated analogue voltage output signal.

2. A method as claimed in claim 1 in which the durations of the time periods between the data samples, the difference values of which are provided are similar.

3. A method as claimed in claim 1 in which the difference values provided are the difference values between each data sample and its immediately preceding data sample.

4. A method as claimed in claim 1 in which the difference values between the data samples and the respective prior data samples are computed.

5. A method as claimed in claim 1 in which each difference value is computed by subtracting the prior data sample of the digital input signal from the current data sample.

6. A method as claimed in claim 1 in which each proportional current signal is indicative of the sign of the corresponding difference value.

7. A method as claimed in claim 1 in which the proportional current signal steered to the predominantly capacitive load impedance in response to a difference value of zero is a zero current signal.

8. A method as claimed in claim 1 in which each proportional current signal steered to the predominantly capacitive load impedance in response to the difference values being positive values is one of a positive flowing proportional current signal and a negative flowing proportional current signal, and each proportional current signal steered to the predominantly capacitive load impedance in response to the difference values being negative values is the other one of a positive flowing proportional current signal and a negative flowing proportional current signal.

9. A method as claimed in claim 8 in which the proportional current signals steered to the predominantly capacitive load impedance in response to the difference values being positive values are positive flowing proportional current signals, and the proportional current signals steered to the predominantly capacitive load impedance in response to the difference values being negative values are negative flowing proportional current signals.

10. A method as claimed in claim 1 in which the difference values are converted to the proportional current signals in a current steering digital-to-analogue converter (DAC).

11. A method as claimed in claim 1 in which the predominantly capacitive load impedance comprises a capacitive element.

12. A method as claimed in claim 11 in which the predominantly capacitive load impedance comprises a resistive element coupled in parallel with the capacitive element for minimising voltage drift of a time average voltage of the analogue voltage output signal resulting from a time average current of the proportional current signals steered to the predominantly capacitive load impedance.

13. A method as claimed in claim 12 in which the resistive element of the predominantly capacitive load impedance is selected to be of resistance value equal to the quotient of a predetermined acceptable voltage offset from a time average voltage of an ideal analogue voltage signal representative of the consecutive data samples divided by the time average current of the proportional current signals steered to the predominantly capacitive load impedance.

14. A method as claimed in claim 11 in which the capacitive element of the predominantly capacitive load impedance is selected to be of capacitance value so that during each time period between the data samples, the difference value of which is provided, the relationship between time and the voltage developed across the predominantly capacitive load impedance resulting from the proportional current signal steered thereto is substantially linear.

15. A method as claimed in claim 1 in which the time constant of the predominantly capacitive load impedance is selected to be of value significantly greater than the time period between the data samples, the difference value of which is provided.

16. A method as claimed in claim 1 in which the predominantly capacitive load impedance is coupled between a first node and a second node, the first node being adapted for receiving a voltage reference, the proportional current signals being steered through the second node, and the analogue voltage output signal being developed on the second node.

17. A method as claimed in claim 1 in which the digital input signal is representative of an arbitrary analogue signal.

18. A method as claimed in claim 1 in which the digital input signal is representative of an oscillating analogue signal oscillating about an average value.

19. A method for operating a current steering DAC for converting a time varying digital input signal comprising consecutive data samples to a continuously linearly interpolated analogue voltage output signal, the method comprising:
sequentially providing difference values between at least some of the data samples and respective prior data samples of the digital input signal to the current steering DAC,
sequentially converting the difference values into respective corresponding analogue proportional current signals in the current steering DAC, the proportional current signals being of current values proportional to the corresponding difference values, and
sequentially steering the proportional current signals to a predominantly capacitive load impedance for respective time periods, the durations of which correspond to the time periods between the data samples, the corresponding difference values of which are provided, for integrating the proportional current signals to develop the continuously linearly interpolated analogue voltage output signal.

20. A method for synthesising a frequency from a reference frequency, the method comprising:
sequentially accumulating a first digital word in a modulo-M accumulator on respective clock cycles of the reference frequency, the first digital word being representative of the value of a numerator of a fractional factor by which the reference frequency is to be multiplied to produce the synthesised frequency, and the modulus M of the accumulator being representative of the value of a denominator of the fractional factor,
sequentially providing difference values between consecutive accumulated values of the first digital word produced by the accumulator on the respective clock cycles of the reference frequency,
sequentially converting the difference values into respective corresponding analogue proportional current signals of current values proportional to the corresponding difference values,
sequentially steering the proportional current signals to a predominantly capacitive load impedance for respective time periods each of duration corresponding to the period of one clock cycle of the reference frequency for integrating the proportional current signals to develop a continuously linearly interpolated analogue voltage signal representative of the accumulated values of the first digital word produced by the accumulator, and
comparing the continuously linearly interpolated analogue voltage signal with a reference voltage level signal for producing the synthesised frequency.

21. A method as claimed in claim 20 in which the difference values between the consecutive accumulated values of the first digital word produced by the accumulator are computed.

22. A method as claimed in claim 21 in which the difference values between the consecutive accumulated values of the first digital word produced by the accumulator are computed by subtracting the immediately previously accumulated value of the first digital word produced by the accumulator from the current accumulated value.

23. A method as claimed in claim 20 in which digital words corresponding to the difference values between the consecutive accumulated values of the first digital word produced by the accumulator are stored, and are sequentially selected in response to the state of the accumulator for conversion into the respective proportional current signals.

24. A method as claimed in claim 23 in which the first digital word is stored to provide one of the difference values, and a second digital word is stored to provide the other one of the difference values, the second digital word being representative of the negative value of the difference of the modulus M of the accumulator less the first digital word, the first digital word being selected for conversion to one of the proportional current signals on each clock cycle of the reference frequency when the accumulator is in a non-overflow state, and the second digital word being selected for conversion to another one of the proportional current signals on each clock cycle of the reference frequency when the accumulator is in an overflow state.

25. A method as claimed in claim 20 in which each positive difference value is converted to one of a positive flowing corresponding proportional current signal and a negative flowing corresponding proportional current signal, and each negative difference value is converted to the other of a positive flowing corresponding proportional current signal and a negative flowing corresponding proportional current signal.

26. A method as claimed in claim 25 in which each positive difference value is converted to a positive flowing proportional current signal, and each negative difference value is converted to a negative flowing proportional current signal.

27. A method as claimed in claim 20 in which the synthesised frequency is derived from each transition of the continuously linearly interpolated analogue voltage signal across the reference voltage level signal when the accumulator is in the non-overflow state.

28. A method as claimed in claim 20 in which the value of the reference voltage level signal is selected to be of value within the value of the minimum positive peak value of the continuously linearly interpolated analogue voltage signal relative to a time average value thereof, and the value of the minimum negative peak value of the continuously linearly interpolated analogue voltage signal relative to the time average value thereof.

29. A method as claimed in claim 20 in which the first digital word is selectable.

30. A method as claimed in claim 20 in which the modulus M of the accumulator is selectable.

31. A digital-to-analogue converter (DAC) for converting a time varying digital input signal comprising consecutive data samples to a continuously linearly interpolated analogue voltage output signal, the DAC comprising:

a digital signal processing circuit for sequentially providing difference values between at least some of the data samples and respective prior data samples of the digital input signal, a current steering DAC circuit for sequentially converting the difference values into respective corresponding analogue proportional current signals of current values proportional to the corresponding difference values, and a predominantly capacitive load impedance to which the proportional current signals are sequentially steered for respective time periods, the durations of which correspond to the time periods between the data samples, the corresponding difference values of which are provided, for integrating the proportional current signals to develop the continuously linearly interpolated analogue voltage output signal.

32. A DAC as claimed in claim 31 in which the durations of the time periods between the data samples, the difference values of which are provided by the digital signal processing circuit are similar.

33. A DAC as claimed in claim 31 in which the difference values provided by the digital signal processing circuit are the difference values between each data sample and its immediately preceding data sample.

34. A DAC as claimed in claim 31 in which the digital signal processing circuit computes the difference values between the data samples and the respective prior data samples.

35. A DAC as claimed in claim 34 in which the digital signal processing circuit determines each difference value by subtracting the prior data sample of the digital input signal from the current data sample.

36. A DAC as claimed in claim 35 in which the digital signal processing circuit comprises a delay register for storing each data sample, which is to be subtracted from a subsequent one of the data samples, for a duration corresponding to the time period between the respective data samples, the difference value of which is to be computed.

37. A DAC as claimed in claim 36 in which the digital signal processing circuit comprises a subtracting circuit for subtracting the data sample currently stored in the delay register from the current data sample for providing each difference value.

38. A DAC as claimed in claim 36 in which the delay register stores each data sample for one clock cycle of a data sampling rate at which the data samples of the digital input signal are provided to the digital signal processing circuit.

39. A DAC as claimed in claim 31 in which the current steering DAC circuit is configured to produce the proportional current signals to be indicative of the sign of the respective corresponding difference values.

40. A DAC as claimed in claim 31 in which the current steering DAC circuit is configured to have a transfer function so that a proportional current signal of current of zero value is produced in response to a difference value of zero.

41. A DAC as claimed in claim 31 in which the current steering DAC circuit is configured to have a transfer function so that ones of positive flowing proportional current signals and negative flowing proportional current signals are produced in response to respective positive difference values, and the others of positive flowing proportional current signals and negative flowing proportional current signals are produced in response to respective negative difference values.

42. A DAC as claimed in claim 41 in which the current steering DAC circuit is configured to have a transfer function so that positive flowing proportional current signals are produced in response to respective positive difference values, and negative flowing proportional current signals are produced in response to negative difference values.

43. A DAC as claimed in claim 31 in which the predominantly capacitive load impedance comprises a capacitive element.

44. A DAC as claimed in claim 43 in which the predominantly capacitive load impedance comprises a resistive element coupled in parallel with the capacitive element for minimising voltage drift of a time average voltage of the analogue voltage output signal resulting from a time average current of the proportional current signals steered to the predominantly capacitive load impedance.

45. A DAC as claimed in claim 44 in which the resistive element of the predominantly capacitive load impedance is selected to be of resistance voltage equal to the quotient of a predetermined acceptable voltage offset from a time average voltage of an ideal analogue voltage signal representative of the consecutive data samples divided by the time average current of the proportional current signals steered to the predominantly capacitive load impedance.

46. A DAC as claimed in claim 31 in which the capacitive element of the predominantly capacitive load impedance is selected to be of capacitance value so that during each time period between the data samples, the difference value of which is provided, the relationship between time and the voltage developed across the predominantly capacitive load impedance resulting from the proportional current signal steered thereto is substantially linear.

47. A DAC as claimed in claim 31 in which the time constant of the predominantly capacitive load impedance is significantly greater than the time period between data samples, the difference value of which is provided.

48. A DAC as claimed in claim 31 in which the predominantly capacitive load impedance is coupled between a first node and a second node, the first node being adapted for receiving a voltage reference, and the second node being coupled to the current steering DAC circuit, the proportional current signals being steered to the predominantly capacitive load impedance through the second node, and the continuously linearly interpolated analogue voltage output signal being developed on the second node.

49. A DAC as claimed in claim 31 in which the current steering DAC circuit comprises a current steering DAC.

50. A DAC as claimed in claim 31 in which the DAC is adapted for converting a digital input signal sampled from an arbitrary analogue signal.

51. A DAC as claimed in claim 31 in which the DAC is adapted for converting a digital input signal sampled from an oscillating analogue signal which oscillates about an average value.

52. A frequency synthesiser for synthesising a frequency from a reference frequency, the frequency synthesiser comprising:

a digital signal processing circuit having a modulo-M accumulator for sequentially producing accumulated values of a first digital word on respective clock cycles of the reference frequency, the first digital word being representative of the value of a numerator of a fractional factor by which the reference frequency is to be multiplied to produce the synthesised frequency, and the modulus M of the accumulator being representative of the value of a denominator of the fractional factor, the digital signal processing circuit sequentially providing difference values between consecutive accumulated values of the first digital word produced by the accumulator on the respective clock cycles of the reference frequency, a current steering DAC circuit for sequentially converting the difference values provided by the digital signal processing circuit to respective analogue proportional current signals of current values proportional to the corresponding difference values, a predominantly capacitive load impedance to which the proportional current signals are sequentially steered by the current steering DAC circuit for respective time periods each of duration corresponding to the period of one clock cycle of the reference frequency for integrating the proportional current signals to develop a continuously linearly interpolated analogue voltage signal representative of the accumulated values of the first digital word produced by the accumulator, and a comparator for comparing the continuously linearly interpolated analogue voltage signal with a reference voltage level signal for producing the synthesised frequency.

53. A frequency synthesiser as claimed in claim 52 in which the digital signal processing circuit comprises a subtracting circuit for subtracting the previous accumulated value of the first digital word produced by the accumulator from the current accumulated value for producing each difference value.

54. A frequency synthesiser as claimed in claim 52 in which the digital signal processing circuit comprises a first digital word storing register for storing the first digital word, and a second digital word storing register for storing a second digital word, the second digital word being representative of the negative value of the difference of the modulus M of the accumulator less the first digital word, the first digital word being applied to the current steering DAC circuit on each clock cycle of the reference frequency when the accumulator is in a non-overflow state, and the second digital word being applied to the current steering DAC circuit on each clock cycle of the reference frequency when the accumulator is in an overflow state.

55. A frequency synthesiser as claimed in claim 54 in which the digital signal processing circuit comprises a multiplexer for selectively and alternately coupling the first and second digital word storing registers to the current steering DAC circuit in response to the state of the accumulator.

56. A frequency synthesiser as claimed in claim 52 in which the predominantly capacitive load impedance comprises a capacitive element.

57. A frequency synthesiser as claimed in claim 56 in which the predominantly capacitive load impedance comprises a resistive element coupled in parallel with the capacitive element for minimising voltage drift of a time average voltage of the continuously linearly interpolated analogue voltage signal resulting from a time average current of the proportional current signals steered to the predominantly capacitive load impedance.

58. A frequency synthesiser as claimed in claim 52 in which the time constant of the predominantly capacitive load impedance is significantly greater than the time period of one clock cycle of the reference frequency.

59. A frequency synthesiser as claimed in claim 52 in which the value of the reference voltage level signal is selected to be of value within the value of the minimum positive peak value of the continuously linearly interpolated analogue voltage signal relative to a time average value thereof, and the value of the minimum negative peak value of the continuously linearly interpolated analogue voltage signal relative to the time average value thereof.

60. A frequency synthesiser as claimed in claim 52 in which the comparator is configured to derive the synthesised frequency in response to the continuously linearly interpolated analogue voltage signal transitioning across the reference voltage level signal when the accumulator is in the non-overflow state.

61. A frequency synthesiser as claimed in claim 52 in which the first digital word is selectable.

62. A frequency synthesiser as claimed in claim 52 in which the modulus M of the accumulator is selectable.

63. A direct digital frequency synthesiser for synthesising an output signal of a selectable frequency from a reference frequency, the direct digital frequency synthesiser comprising:

a numerical controlled oscillator for sequentially producing phase determining digital words on respective clock cycles of the reference frequency indicative of the phase of the synthesised output signal in response to a frequency control digital word, a digital signal processing circuit for sequentially converting the phase determining digital words produced by the numerical controlled oscillator into digital words representative of the phase dependent magnitude of the synthesised output signal on respective clock cycles of the reference frequency, a subtracting circuit for sequentially computing difference values between digital words produced by the digital signal processing circuit on respective clock cycles of the reference frequency and the immediately produced digital word, a current steering DAC circuit for sequentially converting the difference values produced by the subtracting circuit to respective analogue proportional current signals of current values proportional to the corresponding difference values, and a predominantly capacitive impedance load to which the proportional current signals are sequentially steered by the current steering DAC circuit for respective time periods each of duration corresponding to the period of one clock cycle of the reference frequency for integrating the proportional current signals to develop the synthesised output signal of the selected frequency with continuous linear interpolation.

* * * * *